(12) United States Patent
Anzelmo et al.

(10) Patent No.: US 9,997,334 B1
(45) Date of Patent: Jun. 12, 2018

(54) SEEDLESS PARTICLES WITH CARBON ALLOTROPES

(71) Applicant: Lyten, Inc., Sunnyvale, CA (US)

(72) Inventors: Bryce H. Anzelmo, Mountain View, CA (US); Daniel Cook, Woodside, CA (US); Hossein-Ali Ghezelbash, Santa Clara, CA (US); Shreeyukta Singh, Sunnyvale, CA (US); Michael W. Stowell, Sunnyvale, CA (US); David Tanner, San Jose, CA (US)

(73) Assignee: Lyten, Inc., Sunnyvale, CA (US)

( * ) Notice: Subject to any disclaimer, the term of this patent is extended or adjusted under 35 U.S.C. 154(b) by 0 days. days.

(21) Appl. No.: 15/711,620

(22) Filed: Sep. 21, 2017

Related U.S. Application Data

(63) Continuation-in-part of application No. 15/676,649, filed on Aug. 14, 2017, which is a continuation of application No. 15/428,474, filed on Feb. 9, 2017, now Pat. No. 9,767,992.

(51) Int. Cl.
*H01J 37/32* (2006.01)
(52) U.S. Cl.
CPC .... *H01J 37/32192* (2013.01); *H01J 37/3244* (2013.01); *H01J 37/32532* (2013.01); *H01J 2237/334* (2013.01)
(58) Field of Classification Search
None
See application file for complete search history.

(56) References Cited

U.S. PATENT DOCUMENTS

| | | | |
|---|---|---|---|
| 3,706,445 | A | 12/1972 | Gentry |
| 4,701,317 | A | 10/1987 | Arakawa et al. |
| 5,143,709 | A | 9/1992 | Labes |
| 5,211,923 | A | 5/1993 | Harkness et al. |
| 5,324,553 | A | 6/1994 | Ovshinsky et al. |

(Continued)

FOREIGN PATENT DOCUMENTS

| | | |
|---|---|---|
| CN | 1112086 A | 11/1995 |
| CN | 101993060 A | 3/2011 |

(Continued)

OTHER PUBLICATIONS

"Pyrolytic Carbon," Biomedical Engineering Desk Reference, Oxford, UK: Elsevier, 2009, pp. iii-vi and 267.

(Continued)

*Primary Examiner* — Guinever S Gregorio
(74) *Attorney, Agent, or Firm* — The Mueller Law Office, P.C.

(57) ABSTRACT

Carbon materials having carbon aggregates, where the aggregates include carbon nanoparticles and no seed particles, are disclosed. In various embodiments, the nanoparticles include graphene, optionally with multi-walled spherical fullerenes and/or another carbon allotrope. In various embodiments, the nanoparticles and aggregates have different combinations of: a Raman spectrum with a 2D-mode peak and a G-mode peak, and a 2D/G intensity ratio greater than 0.5, a low concentration of elemental impurities, a high Brunauer-Emmett and Teller (BET) surface area, a large particle size, and/or a high electrical conductivity. Methods are provided to produce the carbon materials.

24 Claims, 16 Drawing Sheets

(56) References Cited

U.S. PATENT DOCUMENTS

| | | |
|---|---|---|
| 5,515,011 A | 5/1996 | Pasco |
| 5,556,475 A | 9/1996 | Besen et al. |
| 5,572,866 A | 11/1996 | Loving |
| 5,874,705 A | 2/1999 | Duan |
| 6,156,114 A | 12/2000 | Bell et al. |
| 6,224,736 B1 | 5/2001 | Miyamoto |
| 6,340,912 B1 | 1/2002 | Gerstenberg et al. |
| 6,383,301 B1 | 5/2002 | Bell et al. |
| 6,582,778 B2 | 6/2003 | Namiki et al. |
| 6,805,779 B2 | 10/2004 | Chistyakov |
| 6,914,556 B1 | 7/2005 | Nyswander |
| 6,916,400 B2 | 7/2005 | Moisan et al. |
| 7,022,149 B2 | 4/2006 | Krause et al. |
| 7,102,110 B2 | 9/2006 | Shinohara |
| 7,608,798 B2 | 10/2009 | Kumar et al. |
| 7,739,029 B2 | 6/2010 | Ishikawa et al. |
| 7,799,119 B2 | 9/2010 | Zakrzewski et al. |
| 7,875,322 B2 | 1/2011 | Kobayashi et al. |
| 8,034,321 B2 | 10/2011 | Mauthner et al. |
| 8,075,869 B2 | 12/2011 | Zhu et al. |
| 8,114,375 B2 | 2/2012 | Jang et al. |
| 8,222,579 B2 | 7/2012 | Taguchi et al. |
| 8,337,764 B2 | 12/2012 | Yang et al. |
| 8,475,760 B2 | 7/2013 | Rajala et al. |
| 8,603,402 B2 | 12/2013 | Chang et al. |
| 8,636,960 B2 | 1/2014 | Spitzl et al. |
| 8,808,507 B2 | 8/2014 | Kasin |
| 8,821,745 B2 | 9/2014 | Luo et al. |
| 8,933,629 B2 | 1/2015 | Heil et al. |
| 8,968,588 B2 | 3/2015 | Zhao et al. |
| 9,051,185 B2 | 6/2015 | Levendis et al. |
| 9,156,699 B2 | 10/2015 | Yamada et al. |
| 9,293,302 B2 | 3/2016 | Risby et al. |
| 9,767,992 B1 | 9/2017 | Stowell |
| 9,862,602 B1 | 1/2018 | Riso et al. |
| 9,862,606 B1 | 1/2018 | Cook et al. |
| 2003/0024806 A1 | 2/2003 | Foret |
| 2003/0138365 A1 | 7/2003 | Obidniak et al. |
| 2004/0029339 A1 | 2/2004 | Yamamoto et al. |
| 2004/0261617 A1 | 12/2004 | Stewart |
| 2004/0265211 A1 | 12/2004 | Dillon et al. |
| 2005/0003247 A1 | 1/2005 | Pham |
| 2005/0163696 A1 | 7/2005 | Uhm et al. |
| 2005/0253529 A1 | 11/2005 | Kumar et al. |
| 2007/0212254 A1 | 9/2007 | Nagatsu |
| 2007/0274893 A1 | 11/2007 | Wright et al. |
| 2008/0029030 A1 | 2/2008 | Goto et al. |
| 2009/0196801 A1 | 8/2009 | Mills |
| 2009/0220767 A1 | 9/2009 | Schlogl et al. |
| 2010/0056819 A1* | 3/2010 | Jang .................. B82Y 30/00 556/478 |
| 2011/0033639 A1 | 2/2011 | Coll et al. |
| 2011/0036014 A1 | 2/2011 | Tsangaris et al. |
| 2012/0034137 A1 | 2/2012 | Risby |
| 2012/0058397 A1* | 3/2012 | Zhannu .................. H01M 4/13 429/231.8 |
| 2012/0094175 A1* | 4/2012 | Sheem ................. H01M 4/0471 429/207 |
| 2012/0258374 A1 | 10/2012 | Raston et al. |
| 2013/0248773 A1* | 9/2013 | Chang .................. H01M 4/5825 252/506 |
| 2013/0270110 A1 | 10/2013 | Sasai et al. |
| 2014/0159572 A1 | 6/2014 | Risby et al. |
| 2014/0208638 A1 | 7/2014 | Thorre et al. |
| 2014/0251955 A1 | 9/2014 | Itoh et al. |
| 2014/0263202 A1 | 9/2014 | Partridge |
| 2014/0353207 A1 | 12/2014 | Strohm et al. |
| 2015/0044565 A1* | 2/2015 | Wang .................... H01M 4/366 429/221 |
| 2015/0246813 A1 | 9/2015 | Koveal et al. |
| 2015/0267063 A1* | 9/2015 | Drewer .................... A01C 1/06 47/57.6 |
| 2016/0043384 A1 | 2/2016 | Zhamu et al. |
| 2016/0185603 A1* | 6/2016 | Bozalina .................. B02C 17/20 252/71 |
| 2016/0243518 A1 | 8/2016 | Spitzl |
| 2017/0096341 A1 | 4/2017 | Chen et al. |
| 2017/0113935 A1 | 4/2017 | Pennington et al. |
| 2017/0174520 A1* | 6/2017 | Walters ............... C01B 31/0446 |

FOREIGN PATENT DOCUMENTS

| | | |
|---|---|---|
| CN | 101997120 A | 3/2011 |
| CN | 102502597 B | 6/2013 |
| CN | 102757038 B | 2/2014 |
| CN | 103935989 A | 7/2014 |
| CN | 104058396 A | 9/2014 |
| CN | 102674321 B | 2/2015 |
| CN | 104528690 B | 8/2016 |
| EP | 0184475 B1 | 5/1989 |
| EP | 1502486 B1 | 11/2011 |
| EP | 2702839 B1 | 3/2015 |
| JP | 2000150195 A | 5/2000 |
| JP | 2001220114 A | 8/2001 |
| JP | 2004323345 A | 11/2004 |
| KR | 100583500 B1 | 5/2006 |
| WO | 1999012184 A2 | 3/1999 |
| WO | 2000014518 A1 | 3/2000 |
| WO | 2001009031 A1 | 2/2001 |
| WO | 2004092058 A2 | 10/2004 |
| WO | 2010094969 A1 | 8/2010 |
| WO | 2014090992 A3 | 8/2014 |
| WO | 2015157280 A1 | 10/2015 |
| WO | 2015189643 A1 | 12/2015 |
| WO | 2015193155 A1 | 12/2015 |
| WO | 2015193267 A1 | 12/2015 |
| WO | 2016126599 A1 | 8/2016 |

OTHER PUBLICATIONS

Bystrzejewski et al., "Catalyst-free synthesis of onion-like carbon nanoparticles," New Carbon Materials, vol. 25, No. 1, Feb. 2010, p. 1-8.

Cadez et al., "Influence of Hydrocarbons on Vibrational Excitation of H2 Molecules", Nuclear Engineering and Design, vol. 241, Apr. 2011, p. 1267-1271.

Cho et al., Conversion of natural gas to hydrogen and carbon black by plasma and application of plasma carbon black, Catalysis Today, vol. 98, Issue 4, Nov. 2004, pp. 633-638.

Geng et al., Preparation of graphite nanoplatelets and graphene sheets, Journal of Colloid and Interface Science 336, Apr. 2009, pp. 592-598.

Gicquel et al., "New Driving Parameters for Diamond Deposition Reactors: Pulsed Mode versus Continuous Mode", Materials Research, vol. 6, No. 1, p. 25-37, Sep. 2002.

Hof et al., Conductive inks of graphitic nanoparticles from a sustainable carbon feedstock, Carbon 111, Jan. 2017, pp. 142-149.

Jasinski et al., "Hydrogen Production via Methane Reforming Using Various Microwave Plasma Sources", Chem. Listy 102, s1332-s1337, Jan. 2008.

Konno et al., "Direct Preparation of Hydrogen and Carbon Nanotubes by Microwave Plasma Decomposition of Methane over Fe/Si Activated by Biased Hydrogen Plasma", Green and Sustainable Chemistry, Nov. 2012, 3, p. 19-25.

Notice of Allowance dated Jul. 19, 2017 for U.S. Appl. No. 15/351,858.

Notice of Allowance dated May 24, 2017 for U.S. Appl. No. 15/428,474.

Office Action dated Mar. 23, 2017 for U.S. Appl. No. 15/428,474.

Rodat et al., Characterisation of carbon blacks produced by solar thermal dissociation of methane, Carbon, vol. 49, Issue 9, May 2011, pp. 3084-3091.

Shen and Lua, A facile method for the large-scale continuous synthesis of graphene sheets using a novel catalyst, Scientific Reports, 3, 3037, Oct. 2013, pp. 1-6.

Sun et al., Preparation of carbon black via arc discharge plasma enhanced by thermal pyrolysis, Diamond and Related Materials, vol. 61, Jan. 2016, pp. 21-31.

(56) References Cited

OTHER PUBLICATIONS

Tikhomirov et al., The chemical vapor infiltration of exfoliated graphite to produce carbon/carbon composites, carbon, vol. 49, Issue 1, Jan. 2011, pp. 147-153.
Wu et al., Synthesis of Graphene Sheets with High Electrical Conductivity and Good Thermal Stability by Hydrogen Arc Discharge Exfoliation, ACS Nano, Feb. 2009, vol. 3 (2), pp. 411-417.
Yuan et al., "Low-temperature plasma preparation and application of carbon black nanoparticles", Chemical Engineering Journal, vol. 253, May 2014, pp. 107-120, ISSN 1385-8947.
Office Action dated Dec. 28, 2017 for U.S. Appl. No. 15/725,928.
International Search Report and Written Opinion dated Feb. 9, 2018 for PCT Application No. PCT/US2017/057892.
International Search Report dated Jan. 24, 2018 for PCT Patent Application No. PCT/US/2017/055337.

\* cited by examiner

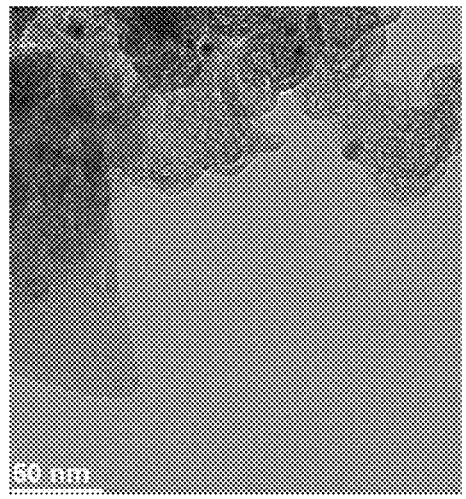 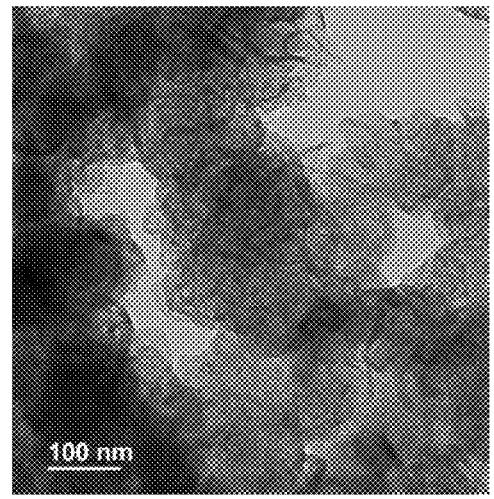
Fig. 5E　　　　　　　　Fig. 5F
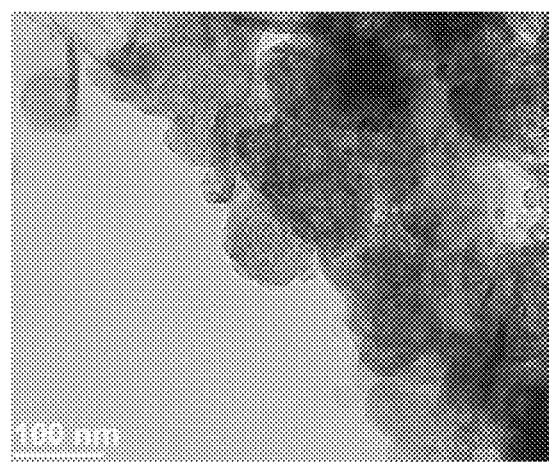
Fig. 5G

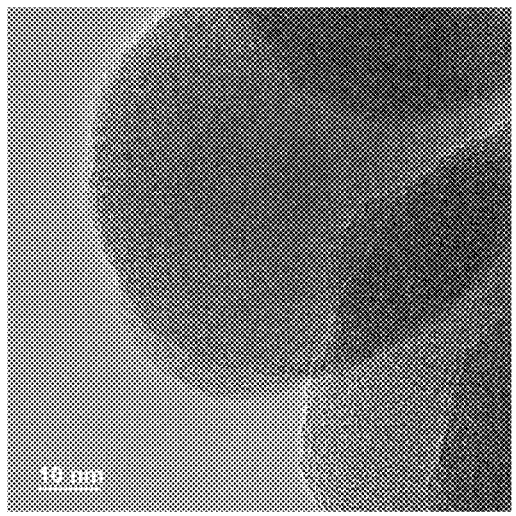 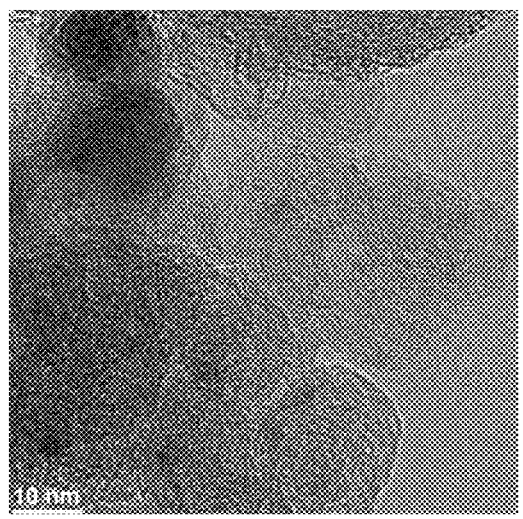
Fig. 5H    Fig. 5I
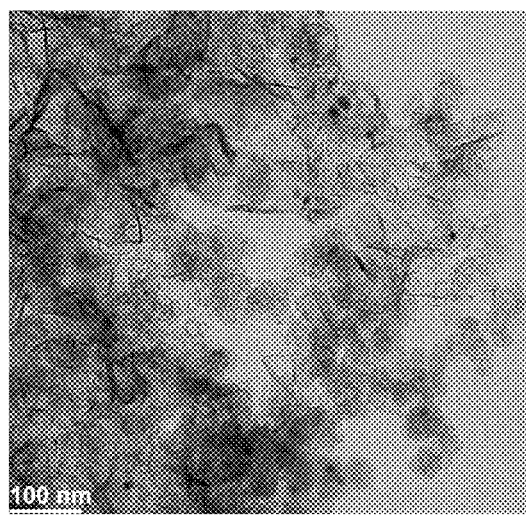
Fig. 5J

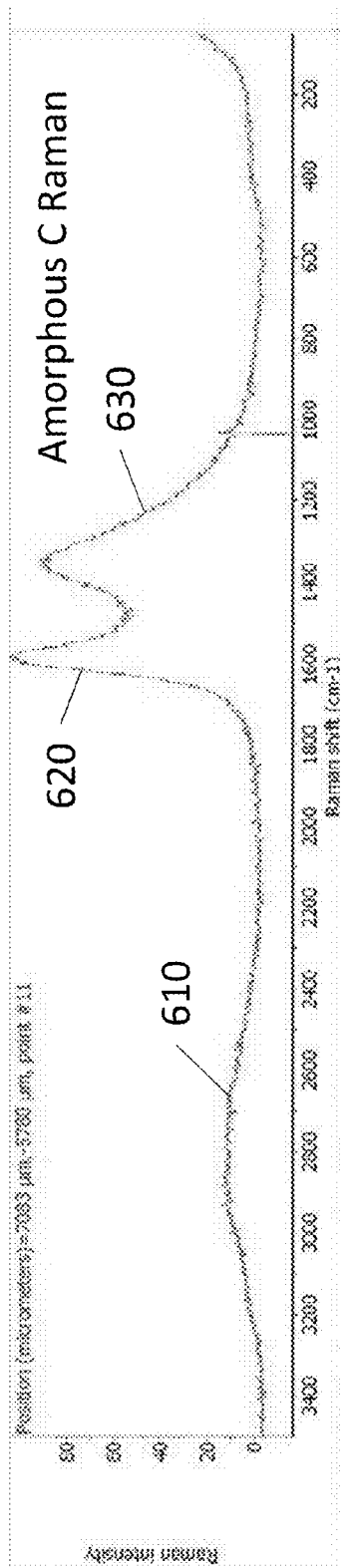
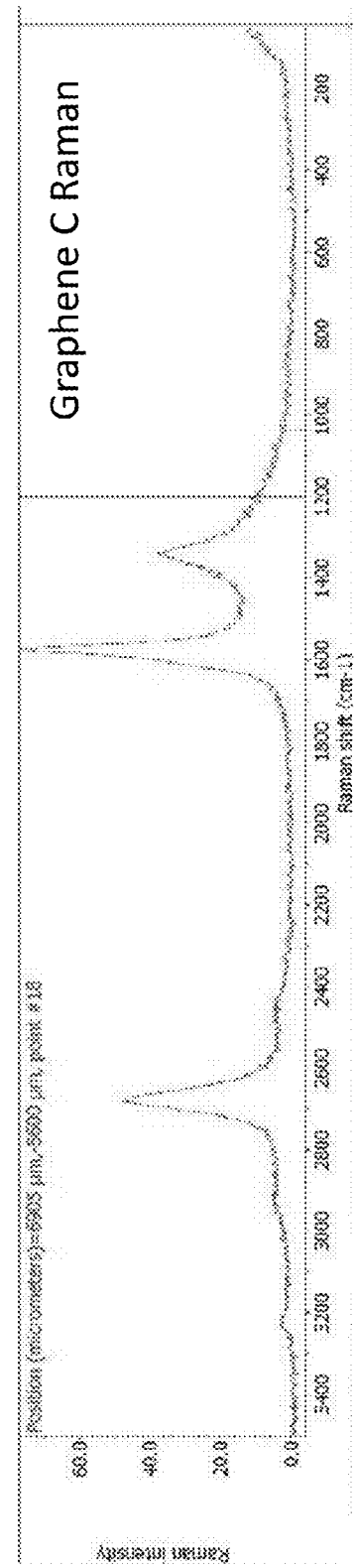
Fig. 6A
Fig. 6B

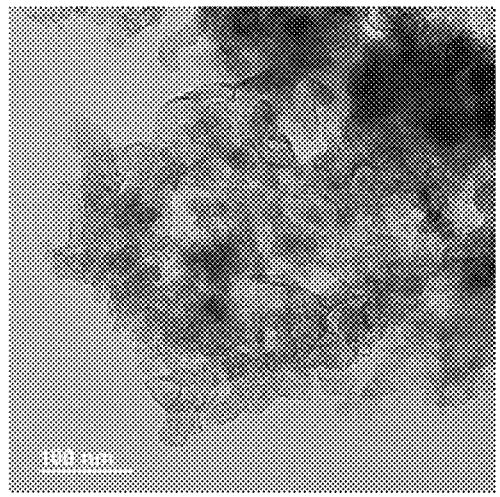 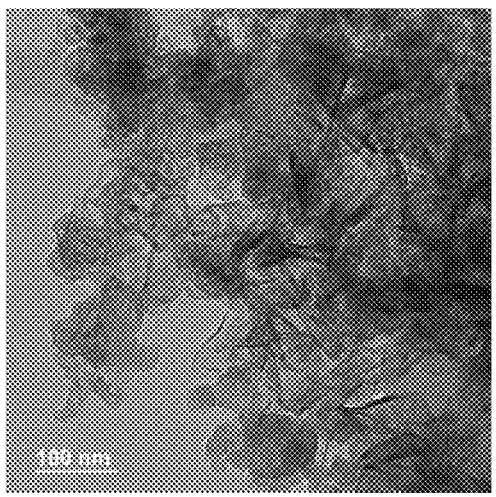
Fig. 6C     Fig. 6D
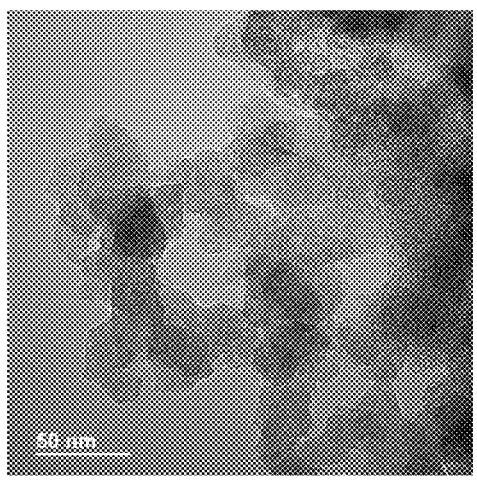
Fig. 6E

SEEDLESS PARTICLES WITH CARBON ALLOTROPES

RELATED APPLICATIONS

This application is a continuation-in-part of U.S. patent application Ser. No. 15/676,649, filed on Aug. 14, 2017 and entitled "Microwave Chemical Processing Reactor"; which is a continuation of U.S. patent application Ser. No. 15/428,474, filed on Feb. 9, 2017, entitled "Microwave Chemical Processing Reactor" and issued as U.S. Pat. No. 9,767,992; all of which are hereby incorporated by reference in their entirety.

BACKGROUND

Carbon particles containing graphite and graphene are used in a wide range of applications ranging from car tire additives, to lubricants, to electronic materials. Some properties that enable their use in such a wide array of applications are high surface areas, and high electrical and thermal conductivities.

Naturally occurring graphene and graphite materials are mined and processed for use in different applications. Naturally occurring graphite and graphene materials contain high concentrations of impurities, and it is difficult and costly to purify naturally occurring graphite and graphene to obtain higher purity materials.

Various crude or refined hydrocarbons (e.g., methane, ethane, propane, etc.) can also be pyrolized or cracked to produce higher-order carbon substances such as graphene and fullerenes, and hydrogen. However, some of the processes used to produce higher-order carbon substances require the use of catalysts, such as metal catalysts, and result in the presence of impurities within the higher-order carbon substances. Furthermore, some processes require the formation of a "seed" or "core" around which the higher-order carbon substances are formed. Additionally, some of these pyrolysis or cracking processes produce particles that are very small (e.g., less than 100 nm in diameter) and are difficult and expensive to collect.

Some examples of higher-order carbon allotropes are shown in FIGS. 1A-1D. FIG. 1A shows a schematic of graphite, where carbon forms multiple layers of a two-dimensional, atomic-scale, hexagonal lattice in which one atom forms each vertex. Graphite is made of single layers of graphene. FIG. 1B shows a schematic of a carbon nanotube, where carbon atoms form a hexagonal lattice that is curved into a cylinder. Carbon nanotubes can also be referred to as cylindrical fullerenes. FIG. 1C shows a schematic of a C60 buckminsterfullerene, where a single layer of a hexagonal lattice of carbon atoms forms a sphere. Other spherical fullerenes exist that contain single layers of hexagonal lattices of carbon atoms, and can contain 60 atoms, 70 atoms, or more than 70 atoms. FIG. 1D shows a schematic of a carbon nano-onion from U.S. Pat. No. 6,599,492, which contains multiple concentric layers of spherical fullerenes.

SUMMARY

In some embodiments, a carbon material comprises a plurality of carbon aggregates, each carbon aggregate having a plurality of carbon nanoparticles, each carbon nanoparticle including graphene, with no seed particles. The graphene in the carbon material has up to 15 layers. A ratio of carbon to other elements, except hydrogen, in the carbon aggregates is greater than 99%. A median size of the carbon aggregates is from 1 to 50 microns. A surface area of the carbon aggregates is at least 50 $m^2/g$, when measured using a Brunauer-Emmett-Teller (BET) method with nitrogen as the adsorbate. The carbon aggregates, when compressed, have an electrical conductivity greater than 500 S/m.

In some embodiments, a carbon material comprises a plurality of carbon aggregates, each carbon aggregate having a plurality of carbon nanoparticles, each carbon nanoparticle including graphene and multi-walled spherical fullerenes, with no seed particles. The graphene in the carbon material has up to 15 layers. A Raman spectrum of the carbon material comprising the multi-walled spherical fullerenes, using 532 nm incident light, has: a D-mode peak, a G-mode peak, and a D/G intensity ratio less than 1.2. A ratio of carbon to other elements, except hydrogen, in the carbon aggregates is greater than 99%. A median size of the carbon aggregates is from 1 to 100 microns. A surface area of the carbon aggregates is at least 10 $m^2/g$, when measured using a BET method with nitrogen as the adsorbate. The carbon aggregates, when compressed, have an electrical conductivity greater than 500 S/m.

In some embodiments, a carbon material comprises a plurality of carbon aggregates, each carbon aggregate having a plurality of carbon nanoparticles, each carbon nanoparticle including a mixture of graphene and at least one other carbon allotrope, with no seed particles. The graphene in the carbon material has up to 15 layers. A ratio of carbon to other elements, except hydrogen, in the carbon aggregates is greater than 99%. A median size of the carbon aggregates is from 1 to 100 microns. A surface area of the carbon aggregates is at least 10 $m^2/g$, when measured using a BET method with nitrogen as the adsorbate. The carbon aggregates, when compressed, have an electrical conductivity greater than 100 S/m.

BRIEF DESCRIPTION OF THE DRAWINGS

FIGS. 5E-5J show TEM images from as-synthesized carbon aggregates containing graphite, graphene and multi-walled spherical fullerenes in a second example, in accordance with some embodiments.

FIGS. 6A and 6B show Raman spectra from as-synthesized carbon aggregates containing graphite, graphene and amorphous carbon in a third example, in accordance with some embodiments.

FIGS. 6C-6E show TEM images from as-synthesized carbon aggregates containing graphite, graphene and amorphous carbon in a third example, in accordance with some embodiments.

DETAILED DESCRIPTION

Figure 1A:
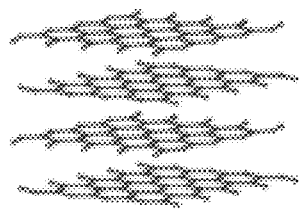
FIGS. 1A-1D are schematics of carbon allotropes from the prior art.
Figure 1B:
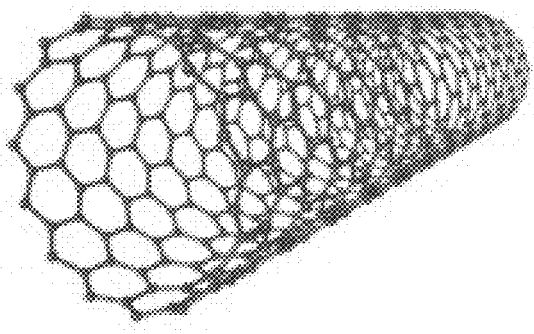
Figure 1C:
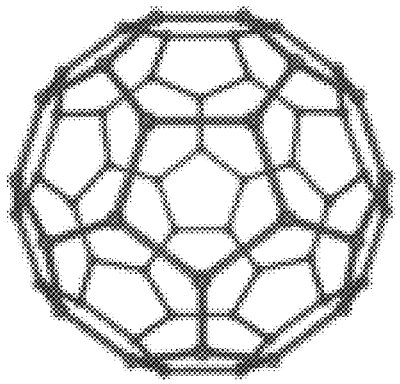
Figure 1D:
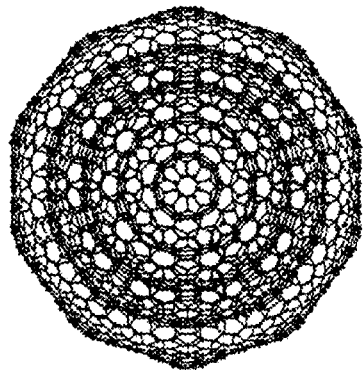

The present disclosure relates to carbon nanoparticles and aggregates that include different allotropes of (i.e., various forms of) carbon, including graphite, graphene, fullerenes, amorphous carbon and combinations thereof, as described below. In some embodiments, the carbon nanoparticles and aggregates are characterized by a high degree of order (i.e., low concentration of defects), and/or high purity (i.e., low concentration of elemental impurities), in contrast to the less ordered and lower purity particles achievable with conventional systems and methods.

The form-factors of the materials described herein are particles (e.g., nanoparticles or aggregates). The form-factors are not films, which are arranged on objects or substrates. In some embodiments, the carbon particles described herein are core-less or seedless (i.e., do not contain a core or a seed of a material other than carbon). In some embodiments, the carbon aggregates described herein are characterized by a size that is substantially larger than comparable prior art particles.

Conventional methods have been used to produce particles containing graphite and graphene with a high degree of order, but the conventional methods lead to carbon products with a variety of shortcomings. For example, naturally occurring graphite can be chemically processed to produce graphene with high electrical conductivities and high surface areas, but the purity is low. In some cases, the particles can be chemically purified to some degree; however, the processes to do so are difficult and costly. In some cases, conventional purification processes produce particles with appreciable concentrations of oxygen, which can reduce the electrical conductivity of the material. Hydrocarbon pyrolysis and cracking methods have also been used to produce particles containing graphite and graphene with a high degree of order (e.g., as evidenced by Raman signatures of ordered material); however, the particles have low purity (e.g., less than 95% carbon to other elements). In some cases hydrocarbon pyrolysis and cracking methods utilizing catalysts or seed particles lead to products that include the catalyst or seed elements and therefore have low purity (e.g., less than 95% carbon to other elements). In some cases, pyrolysis and cracking methods also produce particles with small particle sizes (e.g., less than 100 nm), which makes the particles difficult and expensive to collect. The undesirable properties of the carbon allotropes produced using conventional methods, such as a low degree of order and/or low purity, often lead to undesirable electrical properties of the resulting carbon particles (e.g., low electrical conductivity, or low surface area).

In some cases, conventional methods are capable of producing particles containing carbon allotropes with one or more desirable properties, but lack a desirable combination of properties. For example, some conventional methods are capable of producing graphene with high surface area, but low electrical conductivity due to the presence of residual oxygen.

The seedless carbon nanoparticles and aggregates described herein have low concentration of elemental impurities, and have large particles sizes, high surface areas and high electrical conductivities as-synthesized. In some embodiments, the carbon nanoparticles and aggregates described herein are produced using relatively high speed, low cost, improved microwave reactors and methods, as described below. Additional advantages and/or improvements will also become apparent from the following disclosure.

In the present disclosure, the term "graphene" refers to an allotrope of carbon in the form of a two-dimensional, atomic-scale, hexagonal lattice in which one atom forms each vertex. The carbon atoms in graphene are $sp^2$-bonded. Additionally, graphene has a Raman spectrum with three main peaks: a G-mode at approximately 1580 $cm^{-1}$, a D-mode at approximately 1350 $cm^{-1}$, and a 2D-mode peak at approximately 2690 $cm^{-1}$ (when using a 532 nm excitation laser). In the present disclosure, a single layer of graphene is a single sheet of hexagonally arranged (i.e., $sp^2$-bonded) carbon atoms. It is known that the ratio of the intensity of the 2D-mode peak to the G-mode peak (i.e., the 2D/G intensity ratio) is related to the number of layers in the graphene. A higher 2D/G intensity ratio corresponds to fewer layers in multilayer graphene materials. In different embodiments of the present disclosure, graphene contains fewer than 15 layers of carbon atoms, or fewer than 10 layers of carbon atoms, or fewer than 7 layers of carbon atoms, or fewer than 5 layers of carbon atoms, or fewer than 3 layers of carbon atoms, or contains a single layer of carbon atoms, or contains from 1 to 10 layers of carbon atoms, or contains from 1 to 7 layers of carbon atoms, or contains from 1 to 5 layers of carbon atoms. In some embodiments, few layer graphene (FLG) contains from 2 to 7 layers of carbon atoms. In some embodiments, many layer graphene (MLG) contains from 7 to 15 layers of carbon atoms.

In the present disclosure, the term "graphite" refers to an allotrope of carbon in the form of a two-dimensional, atomic-scale, hexagonal lattice in which one atom forms each vertex. The carbon atoms in graphite are $sp^2$-bonded. Additionally, graphite has a Raman spectrum with two main peaks: a G-mode at approximately 1580 $cm^{-1}$ and a D-mode at approximately 1350 $cm^{-1}$ (when using a 532 nm excitation laser). Similar to graphene, graphite contains layers of hexagonally arranged (i.e., $sp^2$-bonded) carbon atoms. In different embodiments of the present disclosure, graphite can contain greater than 15 layers of carbon atoms, or greater than 10 layers of carbon atoms, or greater than 7 layers of carbon atoms, or greater than 5 layers of carbon atoms, or greater than 3 layers of carbon atoms.

In the present disclosure, the term "fullerene" refers to a molecule of carbon in the form of a hollow sphere, ellipsoid, tube, or other shapes. Spherical fullerenes can also be referred to as Buckminsterfullerenes, or buckyballs. Cylindrical fullerenes can also be referred to as carbon nanotubes. Fullerenes are similar in structure to graphite, which is composed of stacked graphene sheets of linked hexagonal rings. Fullerenes may also contain pentagonal (or sometimes heptagonal) rings.

In the present disclosure, the term "multi-walled fullerene" refers to fullerenes with multiple concentric layers. For example, multi-walled nanotubes (MWNTs) contain multiple rolled layers (concentric tubes) of graphene. Multi-walled spherical fullerenes (MWSFs) contain multiple concentric spheres of fullerenes.

In the present disclosure, the term "amorphous carbon" refers to a carbon allotrope that has minimal or no crystalline structure. One method for characterizing amorphous carbon is through the ratio of $sp^2$ to $sp^3$ hybridized bonds present in the material. The $sp^2$ to $sp^3$ ratios can be determined by comparing the relative intensities of various spectroscopic peaks (including EELS, XPS, and Raman spectroscopy) to those expected for carbon allotropes with $sp^2$ or $sp^3$ hybridization.

In the present disclosure, the term "nanoparticle" refers to a particle that has a size from 1 nm to 900 nm. The nanoparticle can include one or more type of structure (e.g., crystal structure, defect concentration, etc.), and one or more type of atom. The nanoparticle can be any shape, including but not limited to spherical shapes, spheroidal shapes, dumbbell shapes, cylindrical shapes, elongated cylindrical type shapes, rectangular prism shapes, disk shapes, wire shapes, irregular shapes, dense shapes (i.e., with few voids), porous shapes (i.e., with many voids), etc. In the present disclosure, the term "particle" refers to a particle that has any size, including nanoparticles.

In the present disclosure, the term "aggregate" refers to a plurality of particles or nanoparticles that are connected together by Van der Waals forces, by covalent bonds, by ionic bonds, by metallic bonds, or by other physical or chemical interactions. Aggregates can vary in size considerably, but in general are larger than about 500 nm. Throughout this application, the terms "particle" or "particles" are generic terms that can include any size particles, including nanoparticles and aggregates.

The carbon particles and nanoparticles described herein contain graphite and graphene, with no seed particles. In some embodiments, the particles and nanoparticles described herein contain graphite containing greater than 15 layers of carbon atoms, or greater than 10 layers of carbon atoms, or greater than 7 layers of carbon atoms, or greater than 5 layers of carbon atoms, or greater than 3 layers of carbon atoms, and graphene containing fewer than 15 layers of carbon atoms, or fewer than 10 layers of carbon atoms, or fewer than 7 layers of carbon atoms, or fewer than 5 layers of carbon atoms, or fewer than 3 layers of carbon atoms, or contain a single layer of carbon atoms, or contain from 1 to 10 layers of carbon atoms, or contain from 1 to 7 layers of carbon atoms, or contain from 1 to 5 layers of carbon atoms, with no seed particles. In some embodiments, a plurality of the carbon particles or nanoparticles are contained within a carbon aggregate. In some embodiments, a carbon material contains a plurality of the carbon aggregates.

In some embodiments, the carbon particles or nanoparticles further comprise multi-walled spherical fullerenes (MWSFs). In some embodiments, the carbon particles or nanoparticles further comprise connected MWSFs, with layers of graphene coating the connected MWSFs. In some embodiments, the carbon particles or nanoparticles further comprise amorphous carbon.

In some embodiments, the particles and aggregates described herein contain a mixture of graphene and a second allotrope of carbon, and do not contain a seed particle. In some embodiments, the second allotrope of carbon is graphite, MWSFs, connected MWSFs, or amorphous carbon. In some embodiments, the particles and aggregates contain a mixture of graphene, a second allotrope of carbon, and a third allotrope of carbon, and do not contain a seed particle. In some embodiments, the second allotrope is graphite and the third allotrope is MWSFs, connected MWSFs, or amorphous carbon.

Figure 1E:
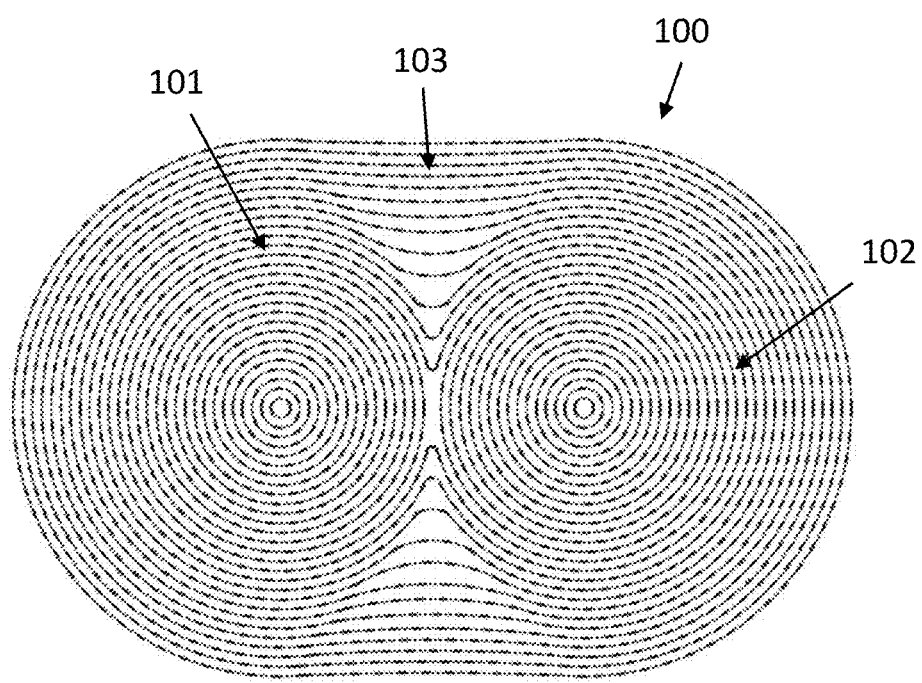
FIG. 1E is a schematic of idealized connected multi-walled spherical fullerenes, in accordance with some embodiments.

In some embodiments, the carbon nanoparticles and aggregates described herein are characterized by a well-ordered structure with high purity as illustrated by an idealized carbon nanoparticle 100 shown in FIG. 1E. The carbon allotrope in FIG. 1E contains two connected multi-walled spherical fullerenes (MWSFs) 101 and 102 with layers of graphene 103 coating the connected MWSFs 101 and 102. The allotrope shown in FIG. 1E is also core-less (i.e., does not contain a core of a material other than carbon at the center of the spherical fullerene). The idealized nanoparticle shown in FIG. 1E has high uniformity since the ratio of MWSFs to graphene is high, is well-ordered since there are no point defects (e.g., missing carbon atoms) and no distorted carbon lattices, and has a high purity since there are no elements (e.g., a core of impurities) other than carbon, in contrast with low uniformity mixtures of MWSFs mixed with other carbon allotropes, poorly-ordered MWSFs with many point defects and distorted lattices, and low purity MWSFs (e.g., with seed particles at the core). In other embodiments, the connected MWSFs do contain a core. In some embodiments, the core is a void, or a carbon-based material that is not an MWSF (e.g., amorphous carbon), or a seed that is not carbon-based.

In some embodiments, the aggregates described herein contain graphene (e.g., containing up to 15 layers) and graphite (e.g., containing greater than 15 layers) and have a ratio of graphene to graphite from 20% to 80%, a high degree of order (e.g., a Raman signature with the ratio of the intensity of the 2D-mode peak to the G-mode peak greater than 0.5), and a high purity (e.g., the ratio of carbon to other elements, other than H, is greater than 99.9%). In some embodiments, the ratio graphene to graphite is from 10% to 90%, or from 10% to 80% or from 10% to 60%, or from 10% to 40%, or from 10% to 20%, or from 20% to 40%, or from 20% to 90%, or from 40% to 90%, or from 60% to 90%, or from 80% to 90%. In some embodiments, the particles produced using the methods described herein contain graphite and graphene, and do not contain a core composed of impurity elements other than carbon. In some cases, the aggregates of the particles have large diameters (e.g., greater than 10 microns across).

In some embodiments, the aggregates described herein contain graphene, MWSFs or connected MWSFs, and optionally graphite, and have a ratio of graphene to MWSF from 20% to 80%, a high degree of order (e.g., a Raman signature with ratio of the intensities of the D-mode peak to G-mode peak from 0.95 to 1.05), and a high purity (e.g., the ratio of carbon to other elements, other than H, is greater than 99.9%). In some embodiments, the ratio graphene to MWSFs or connected MWSFs is from 10% to 90%, or from 10% to 80% or from 10% to 60%, or from 10% to 40%, or from 10% to 20%, or from 20% to 40%, or from 20% to 90%, or from 40% to 90%, or from 60% to 90%, or from 80% to 90%. In some embodiments, the particles produced using the methods described herein contain MWSFs or connected MWSFs, and the MWSFs do not contain a core composed of impurity elements other than carbon. In some cases, the aggregates of the particles have large diameters (e.g., greater than 10 microns across).

In some embodiments, the aggregates described herein contain graphene, amorphous carbon, and optionally graphite, and have a ratio of graphene to amorphous carbon from 20% to 80%, and have a high purity (e.g., the ratio of carbon to other elements, other than H, is greater than 99.9%). In some embodiments, the ratio graphene to amorphous carbon is from 10% to 90%, or from 10% to 80% or from 10% to 60%, or from 10% to 40%, or from 10% to 20%, or from 20% to 40%, or from 20% to 90%, or from 40% to 90%, or from 60% to 90%, or from 80% to 90%. In some embodiments, the particles produced using the methods described herein contain amorphous carbon, and do not contain a core composed of impurity elements other than carbon. In some cases, the aggregates of the particles have large diameters (e.g., greater than 10 microns across).

In some embodiments, the carbon material has a ratio of carbon to other elements, except Hydrogen, greater than 99%, or greater than 99.5%, or greater than 99.7%, or greater than 99.9%, or greater than 99.95%.

In some embodiments, the median size of the carbon aggregates is from 1 micron to 50 microns, or from 2 microns to 20 microns, or from 5 microns to 40 microns, or from 5 microns to 30 microns, or from 10 microns to 30 microns, or from 10 microns to 25 microns, or from 10 microns to 20 microns. In some embodiments, the size distribution of the carbon aggregates has a $10^{th}$ percentile from 1 micron to 10 microns, or from 1 micron to 5 microns, or from 2 microns to 6 microns, or from 2 microns to 5 microns. The size of the particles that make up the aggregates can vary in size, and can be smaller than 10 nm or up to hundreds of nanometers in size. In some embodiments, the size of aggregates is measured using TEM images. In some embodiments, the size of the aggregates is measured using a laser particle size analyzer (e.g., a Fritsch Analysette 22 MicroTec plus).

In some embodiments, the surface area of the carbon aggregates, when measured using the Brunauer-Emmett-Teller (BET) method with nitrogen as the adsorbate (i.e., the "BET method using nitrogen", or the "nitrogen BET method") or the Density Functional Theory (DFT) method, is from 50 to 300 $m^2/g$, or from 100 to 300 $m^2/g$, or from 50 to 200 $m^2/g$, or from 50 to 150 $m^2/g$, or from 60 to 110 $m^2/g$, or from 50 to 100 $m^2/g$, or from 70 to 100 $m^2/g$.

In some embodiments, the carbon aggregates, when compressed (e.g., into a disk, pellet, etc.), and optionally annealed, have an electrical conductivity greater than 500 S/m, or greater than 1000 S/m, or greater than 2000 S/m, or from 500 S/m to 20,000 S/m, or from 500 S/m to 10,000 S/m, or from 500 S/m to 5000 S/m, or from 500 S/m to 4000 S/m, or from 500 S/m to 3000 S/m, or from 2000 S/m to 5000 S/m, or from 2000 S/m to 4000 S/m, or from 1000 S/m to 5000 S/m, or from 1000 S/m to 3000 S/m.

The carbon nanoparticles and aggregates described herein are characterized by Raman spectroscopy to determine the species of carbon allotropes present, and their degree of order. The main peaks in the Raman spectra for graphite and graphene are the G-mode, the D-mode and the 2D-mode. The G-mode peak has a wave number of approximately 1580 $cm^{-1}$, and is attributed to the vibration of carbon atoms in $sp^2$-hybridized carbon networks. The D-mode peak has a wave number of approximately 1350 $cm^{-1}$, and can be related to the breathing of hexagonal carbon rings with defects. The 2D-mode peak is a second-order overtone of the D-mode and has a wave number of approximately 2690 $cm^{-1}$.

In some embodiments, the graphite- and graphene-containing carbon materials have a Raman spectrum (using 532 nm incident light) with a 2D-mode peak and a G-mode peak, and the 2D/G intensity ratio is greater than 0.2, or greater than 0.5, or greater than 1.

Raman spectroscopy can also be used to characterize the structure of MWSFs. When using 532 nm incident light, the Raman G-mode is typically at 1582 $cm^{-1}$ for planar graphite, but can be downshifted for MWSFs (e.g., to 1565-1580 $cm^{-1}$). The D-mode is observed at approximately 1350 $cm^{-1}$ in the Raman spectra of MWSFs. The ratio of the intensities of the D-mode peak to G-mode peak (i.e., the D/G intensity ratio) is related to the degree of order of the MWSFs, where a lower D/G intensity ratio indicates higher degree of order. A D/G intensity ratio near or below 1 indicates a relatively high degree of order, and a D/G intensity ratio greater than or equal to 1.2 indicates lower degree of order.

In some embodiments, the carbon materials containing the MWSFs have a Raman spectrum (using 532 nm incident light) with a D-mode peak and a G-mode peak, and the D/G intensity ratio is from 0.9 to 1.1, or less than about 1.2.

In some embodiments, the carbon materials containing amorphous carbon have a Raman spectrum (using 532 nm incident light) with a 2D-mode peak, a D-mode peak and a G-mode peak, and the D/G intensity ratio is greater than 0.5. In some embodiments, the Raman spectrum also has a low intensity 2D-mode peak. In some embodiments, the 2D-mode peak has an intensity less than approximately 30% of the G-mode peak intensity, or less than 20% of the G-mode peak intensity, or less than 10% of the G-mode peak intensity. In some embodiments, the Raman spectrum has a D-mode peak and G-mode peak with a shallow valley between them. In some embodiments, the minimum intensity of the shallow valley between the D-mode peak and the G-mode peak is greater than approximately 40% of the G-mode peak intensity, or greater than approximately 50% of the G-mode peak intensity, or greater than approximately 60% of the G-mode peak intensity.

Methods for Proucing Graphite and Graphene Materials E

In some embodiments, the carbon particles, nanoparticles, aggregates and materials described herein are produced using microwave plasma reactors and methods, such as any appropriate microwave reactor and/or method described in U.S. patent application Ser. No. 15/351,858, entitled "Microwave Chemical Processing," or in the aforementioned U.S. patent application Ser. No. 15/428,474, entitled "Microwave Chemical Processing Reactor," which are assigned to the same assignee as the present application, and are incorporated herein by reference as if fully set forth herein for all purposes. Additional information and embodiments for microwave plasma gas processing system methods and apparatuses to produce the carbon nanoparticles and aggregates described herein are also described in the aforementioned U.S. Patent Applications.

In some embodiments, microwave plasma chemical processing of process materials (e.g., hydrocarbon gases, or liquid mixtures) is used to produce the carbon particles, nanoparticles and aggregates described herein. More specifically, microwave plasma chemical processing of precursor materials using various techniques, including pulsing of the microwave radiation to control the energy of the plasma, can be used to produce the carbon nanoparticles and aggregates described herein. The ability to control the energy of the plasma enables the selection of one or more reaction pathways in conversion of the precursor materials into specific separated components. Pulsed microwave radiation can be used to control the energy of the plasma, because the short-lived high-energy species that are created when a plasma ignites can be re-generated at the start of each new pulse. The plasma energy is controlled to have a lower average ion energy than conventional techniques, but at a high enough level to enable the targeted chemical reactions to occur at high precursor material flows and high pressures.

Conventional microwave plasma chemical processing systems using pulsed microwave radiation to control the energy of the plasma have very high cracking efficiency, in excess of 90%. These conventional systems, however, use low gas flow rates, below 1 standard liter per minute (slm), and small gas volumes within the plasma, with a consequence that the production rate is low and the production cost is high. These conventional systems cannot increase the gas flow rate and the gas volume within the plasma while using high frequency microwave pulsing (e.g., above approximately 100 Hz) because the plasma cannot ignite fast enough to keep up with the pulses when a large volume and high flow of gas is used.

In contrast to previously developed systems, in some embodiments, a microwave plasma can be generated in a supply gas and/or precursor material, and the energy in the plasma is sufficient to form separated components, including the carbon nanoparticles and aggregates described herein, from precursor material molecules. In some embodiments, a source of microwave radiation is coupled to a reaction chamber, the plasma is generated along a first portion of the length of the reaction chamber, and the precursor material is separated into components, including the carbon nanoparticles and aggregates described herein, along a second portion of the length of the reaction chamber. In some embodiments, the microwave radiation is coupled directly into the plasma and not through a dielectric wall as in conventional methods.

In methods of the present embodiments regarding microwave plasma chemical processing of precursor materials to produce the carbon nanoparticles and aggregates described herein, pulsed microwave radiation is supplied through a waveguide having a length, where the microwave radiation propagates in a direction along the waveguide. A pressure within the waveguide is at least 0.1 atmosphere. A supply gas is provided into the waveguide at a first location along a length of the waveguide, where a majority of the supply gas flows in the direction of the microwave radiation propagation. A plasma is generated in the supply gas in at least a portion of the length of the waveguide, and a precursor material (e.g., a process gas, or a liquid precursor) is added into the waveguide at a second location downstream from the first location. A majority of the precursor material flows in the direction of the microwave propagation at a rate greater than 5 slm, or greater than 5 L/min for liquid mixtures. An average energy of the plasma is controlled to convert the precursor material into separated components, including the carbon nanoparticles and aggregates described herein, by controlling at least one of i) a pulsing frequency of the pulsed microwave radiation, where the pulsing frequency is greater than 500 Hz; and ii) a duty cycle of the pulsed microwave radiation, where the duty cycle is less than 90%.

In gas processing systems of the present embodiments regarding microwave plasma chemical processing of precursor materials to produce the carbon nanoparticles and aggregates described herein, the systems include a waveguide having a first gas inlet, a second gas inlet downstream of the first gas inlet, and a length. The first inlet is configured to receive a supply gas, and the second inlet is configured to receive a precursor materials (e.g., a process gas, or a liquid mixture). A pulsed microwave radiation source is coupled to the waveguide to generate a plasma in the supply gas, where the microwave radiation propagates in a direction along the length of the waveguide to react with the precursor material. The microwave radiation source is configured to pulse microwave radiation on and off at a frequency from 500 Hz to 1000 kHz and with a duty cycle less than 90%. The majority of the flow of the supply gas and the majority of the flow of the precursor material are parallel to the direction of the microwave propagation. The flow of the process gas is greater than 5 slm, and the waveguide is configured to accommodate pressures of at least 0.1 atmosphere.

Figure 2A:
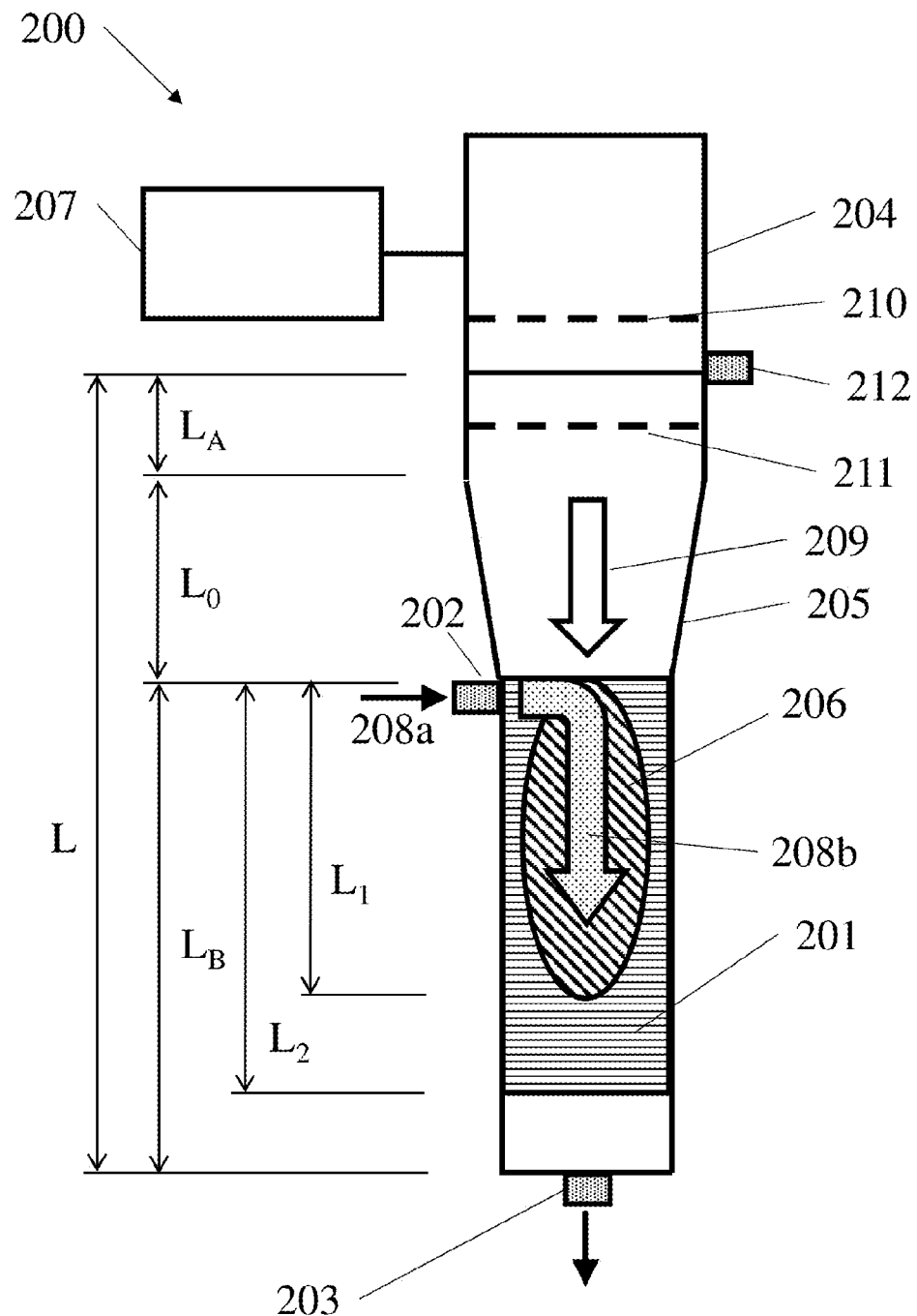
FIG. 2A is a simplified vertical cross-section of a microwave gas processing system, in accordance with some embodiments of the present disclosure.

FIG. 2A shows an embodiment of a microwave chemical processing system of the present disclosure, in which a "field-enhancing waveguide" (FEWG) is coupled to a microwave energy generator (i.e., a microwave energy source), a plasma is generated from a supply gas in a plasma zone of the FEWG, and a reaction length of the FEWG serves as the reaction zone to separate the process material into separate components. The present reactor as demonstrated by FIG. 2A is absent of a dielectric barrier between the field-enhancing zone of the field-enhancing waveguide and the reaction zone. In contrast, the reaction zones of conventional systems, are enclosed within a dielectric barrier such as a quartz chamber as explained previously. The direction of propagation of the microwave energy is parallel to the majority of the flow of the supply gas and/or the process material (i.e., precursor material), and the microwave energy enters the waveguide upstream of the portion of the FEWG where the separated components are generated.

As shown in FIG. 2A, a microwave chemical processing reactor 200, in accordance with some embodiments, generally includes a FEWG 205, one or more inlets 202 configured to receive supply gas and/or process material 208a flowing into the FEWG 205, and a microwave energy source 204 that is coupled to the FEWG 205, among other elements not shown for simplicity. The "process material" can also be referred to as a "precursor material", or in some embodiments, a "process gas". The inlets 202 can be designed to accommodate gaseous or liquid mixture precursor materials. In the case of liquid precursors, in some embodiments, the inlet 202 can include an atomizer (or other assembly) to effectively disperse the liquid precursor in the reactor. In some embodiments, a bubbler can be used to vaporize a liquid, and the vapor provided to the inlet 202.

In some embodiments, microwave circuit 207 controls a pulsing frequency at which microwave energy 209 from microwave energy source 204 is pulsed. In some embodiments, the microwave energy 209 from microwave energy source 204 is continuous wave.

The FEWG 205 has a length L. The portion of the FEWG 205 with length $L_A$ (shown in FIG. 2A) is closer to the microwave energy generator than the portion of the FEWG with length $L_B$ (shown in FIG. 2A). Throughout this disclosure, different portions of the FEWG will be described by a capital L with a subscript denoting the certain portion of the FEWG (e.g., $L_A$, $L_0$, $L_B$, $L_1$, $L_2$), and synonymously, the lengths of the different portions of the FEWG will also be described by a capital L with a subscript denoting the length of a certain portion of the FEWG (e.g., $L_A$, $L_0$, $L_B$, $L_1$, $L_2$).

The cross-sectional area of the FEWG in length $L_B$ is smaller than the cross-sectional area of the FEWG in length $L_A$. The length of the FEWG $L_0$, is located between lengths $L_A$ and $L_B$ of the FEWG, and has a decreasing cross-sectional area along the path of the microwave energy propagation. The decrease in cross-sectional area serves to concentrate the electric field, thus increasing the microwave energy density while still providing a significant amount of area in which plasma can be formed compared to conventional systems. The portion of the FEWG with length $L_B$ (shown in FIG. 2A) may have a rectangular cross-section of dimensions 0.75 inches by 3.4 inches when using a microwave energy frequency of 2.45 GHz. This cross-sectional area is much greater than conventional systems where the plasma generation area is generally less than one square inch. The dimensions of the different portions of the FEWG 205 are set according to the microwave frequency, in order to properly function as a waveguide. For example, for an elliptical waveguide the cross-sectional dimensions can be 5.02 inches by 2.83 inches for 2.1-2.7 GHz.

In conventional microwave plasma materials processing systems, the limited region in which plasma can form, such as less than one square inch as described above, constrains the volume in which gas reactions can occur. Also, in conventional systems the microwave energy enters the reaction chamber through a window (typically quartz). In these systems, dielectric materials (e.g., particulate carbon) are coated on the window during processing leading to a decreased power delivery over time. This can be highly problematic if these separated components absorb microwave energy because they can prevent the microwave energy from coupling into the reaction chamber to generate the plasma. Consequently, a rapid build-up of by-products, such as carbon particles that are produced from the gas reactions, occurs and limits the run-time of the processing equipment. In the present embodiments, the system 200 and other embodiments described below are designed without the use of a window in the reaction zone; that is, using a parallel propagation/gas flow system where the energy enters upstream from the reaction. As a result, more energy and power can be coupled into the plasma from the microwave energy source. The lack of a window and the greater volume within the waveguide 205, compared to limited reaction chamber volumes in conventional systems, greatly reduces the issue of particle build-up causing limited run-times, thus improving production efficiency of the microwave processing system.

The microwave energy 209 in FIG. 2A creates a microwave plasma 206 in the supply gas and/or process material within a plasma zone with length $L_1$ (shown in FIG. 2A) of the length of the FEWG 205. The plasma zone with length $L_1$ is located within the portion of the FEWG $L_B$, where the cross-sectional area is smaller and the microwave energy density is higher than in length $L_A$. In some embodiments, a supply gas that is different from the process material is used to generate the microwave plasma 206. The supply gas may be, for example, hydrogen, helium, nitrogen, a noble gas such as argon, or mixtures of more than one type of gas. In other embodiments, the supply gas is the same as the process material, where the process material is the material from which separated components are being created.

In some embodiments, the supply gas and/or process material inlet 202 is located upstream from the portion of the FEWG $L_B$, or is located within the portion of the FEWG $L_0$, or is located within the portion of the FEWG $L_A$, or is located upstream of the portion of the FEWG $L_A$. In some embodiments, the portion of the FEWG $L_1$ extends from a position along the FEWG downstream from the position where the supply gas and/or process material 208a enters the FEWG, to the end of the FEWG or to a position between the entrance of the supply gas and/or process material and the end of the FEWG 205. In some embodiments, the portion of the FEWG $L_1$ extends from where the supply gas and/or process material 208a enters the FEWG, to the end of the FEWG or to a position between the entrance of the supply gas and/or process material and the end of the FEWG.

The generated plasma 206 provides energy for reactions to occur in process material 208b within a reaction zone 201 of the FEWG 205 having a reaction length $L_2$. In some embodiments, reaction zone $L_2$ extends from where the process material 208a enters the FEWG 205, to the end of the FEWG 205 or to a position between the entrance of the process material and the end of the FEWG 205. Given the right conditions, the energy in the plasma 206 will be sufficient to form separated components from the process material molecules. One or more outlets 203 are configured to collect the separated products out of the FEWG 205 downstream of the reaction zone portion 201 of the FEWG where reactions occur in the process material 208b. In the example shown in FIG. 2A, the propagation direction of the microwave energy 209 is parallel with the majority of the supply gas and/or process material flow 208b, and the microwave energy 209 enters the FEWG 205 upstream of the reaction zone 201 of the FEWG where the separated components are generated.

In some embodiments, a pressure barrier 210 that is transparent to microwave energy can be located within the microwave energy source 204, near the outlet of the microwave energy source, or at other locations between the microwave energy source 204 and the plasma 206 produced in the FEWG. This pressure barrier 210 can serve as a safety measure to protect from potential backflow of plasma into the microwave energy source 204. Plasma does not form at the pressure barrier itself; instead, the pressure barrier is simply a mechanical barrier. Some examples of materials that the pressure barrier can be made of are quartz, ethylene tetrafluoroethylene (ETFE), other plastics, or ceramics. In some embodiments, there can be two pressure barriers 210 and 211, where one or both pressure barriers 210 and 211 are within the microwave energy source 204, near the outlet of the microwave energy source, or at other locations between the microwave energy source 204 and the plasma 206 produced in the FEWG. In some embodiments, the pressure barrier 211 is closer to the plasma 206 in the FEWG than the pressure barrier 210, and there is a pressure blowout port 212 between the pressure barriers 210 and 211 in case the pressure barrier 211 fails.

In some embodiments, the local impedance within the FEWG is tailored using filaments, point sources, electrodes and/or magnets. In some embodiments, filaments, point sources, electrodes and/or magnets are used to increase the density plasma within the reaction zone of the FEWG.

Figure 2B:
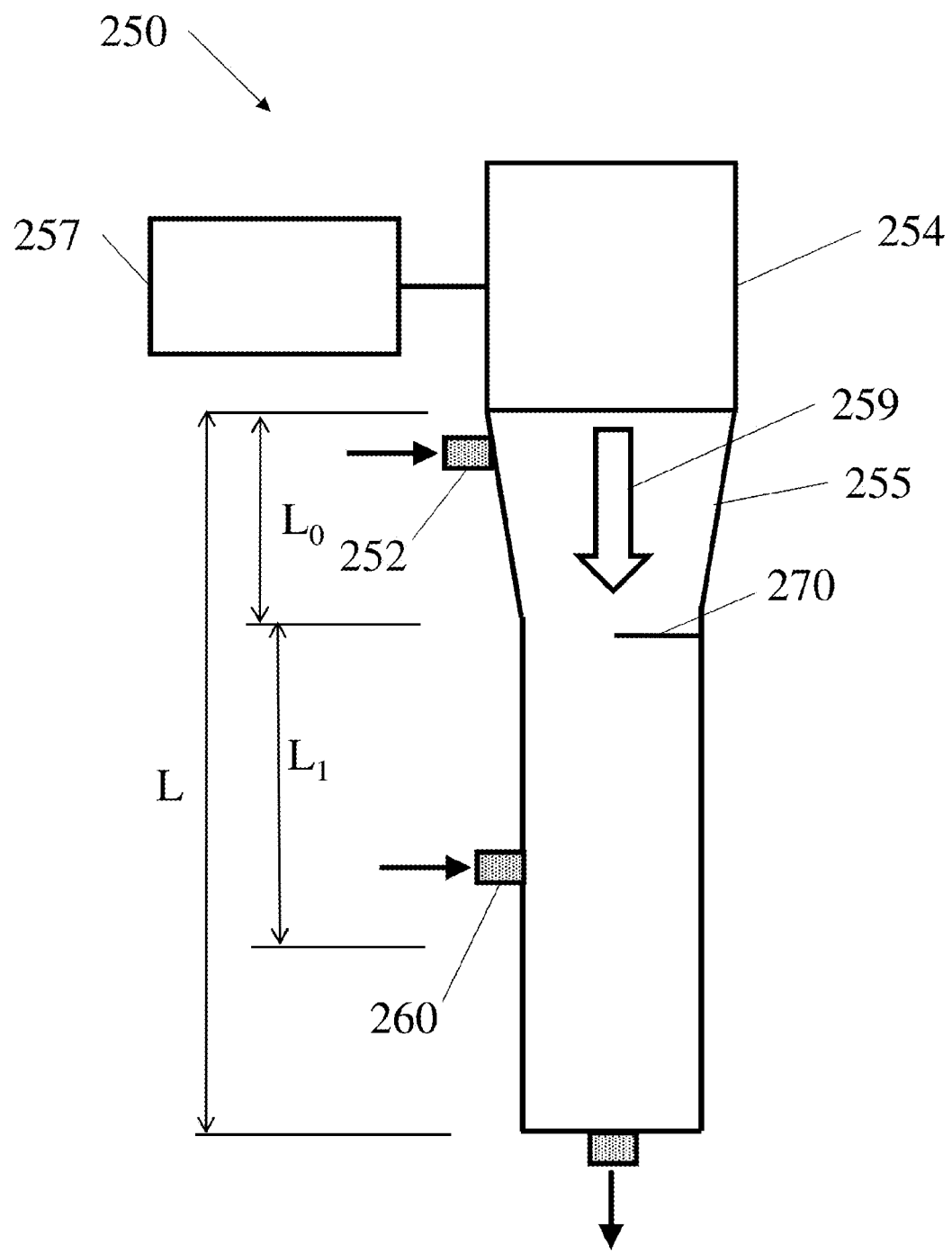
FIG. 2B is a simplified vertical cross-section of a microwave gas processing system having a filament, in accordance with embodiments of the present disclosure.

FIG. 2B illustrates a microwave processing system with a FEWG and filaments. In the embodiment of FIG. 2B, the microwave processing system 250 includes a microwave energy generator (i.e., a microwave energy source) 254, a FEWG 255, and a microwave emitter circuit 257 similar to previous embodiments. Microwave energy 259 is supplied by the microwave energy source 254, to propagate in a direction down the length L of the FEWG 255. In this embodiment, supply gas inlet 252 is placed near the entrance of the portion $L_0$, rather than at the entrance to the portion $L_1$ (i.e., the plasma zone) as was illustrated in previous embodiments. One or more metal filaments 270 is placed within the FEWG 255 to assist in the ignition of the plasma and/or the excitation of higher energy species within the plasma. In this embodiment, metal filament 270 is downstream of the first gas inlet 252, near the entrance to the plasma zone portion of the FEWG $L_1$ (with a smaller cross-sectional area than the FEWG closer to the microwave energy generator). In other embodiments, the filament 270 may be located at other locations within portion $L_1$ of the overall length L of the FEWG 255, where $L_1$ is the region in the waveguide where the plasma is formed as described in relation to previous embodiments. In some embodiments, the filament 270 is located within portion $L_1$ of the FEWG and upstream of the process material inlet 260, so that it will be located outside of the portion $L_2$ (i.e., length $L_2$ shown in FIG. 2A) where reactions are taking place and which could coat the filament with reacted species. The presence of filament 270 can reduce the plasma ignition voltage by providing an ignition site, by focusing the electric field of microwave energy 259. Additionally, the filament 270 can become heated and emit electrons through thermionic emission, which further contributes to reducing the plasma ignition voltage. Although the filament 270 is illustrated as a single wire in this embodiment, filament 270 may take other configurations such as a coil or multiple filaments. In some embodiments, the filament 270 is tungsten. In some embodiments, the filament may be actively energized (powered) or may be passive. In some embodiments, the filament 270 is an osmium filament (e.g., configured as a plate, or coil, or other shape) adjacent to a heater coil. In some embodiments, the filament 270 is a ferrous material in the field of an inductive coil. In some embodiments, the filament 270 is actively heated where the active components (e.g., heating source components) are located outside of the waveguide 255 and the filament material that is being heated is inside of the waveguide 255.

The filament 270 within the FEWG can assist with the plasma ignition. In some embodiments, an advantage of using a filament 270 within the FEWG is that it enables a plasma to form quickly enough to keep up with fast microwave pulsing frequencies (e.g., at frequencies greater than 500 Hz, or greater than 1 kHz), even with high gas flows (e.g., greater than 5 slm) and large gas volumes (e.g., up to 1000 L). This is particularly important at high pressures (e.g., greater than 0.9 atm, or greater than 1 atm, or greater than 2 atm), because the high energy species will extinguish quickly in a high pressure atmosphere, and if the plasma cannot ignite fast enough, then there will be a low fraction of high-energy species (i.e., integrated over time) in a pulsed plasma at high pressures.

In some embodiments, the precursor materials (i.e., process materials) to produce the carbon nanoparticles and the carbon aggregates described herein are gaseous, including hydrocarbon gases, such as $C_2H_2$, $C_2H_4$, $C_2H_6$, carbon dioxide with water, trimethylaluminum (TMA), trimethylgallium (TMG), glycidyl methacrylate (GMA), methylacetylene-propadiene, propadiene, propane, propyne, acetylene, or any mixture or combination thereof, In some embodiments, the precursors are other materials used in the semiconductor industry for the deposition and etching of metals and dielectrics. In some embodiments, the precursor materials (i.e., process materials) to produce the carbon nanoparticles and the carbon aggregates described herein are liquid mixtures, including isopropyl alcohol (IPA), ethanol, methanol, condensed hydrocarbons (e.g., hexane), or other liquid hydrocarbons.

In some embodiments, the carbon nanoparticles and aggregates including the different carbon allotropes described herein are produced using the microwave plasma reactors with gas flows from 1 slm (standard liters per minute) to 1000 slm, or from 2 slm to 1000 slm, or from 5 slm to 1000 slm, or greater than 1 slm, or greater than 2 slm, or greater than 5 slm, or greater than 10 slm, or greater than 100 slm. In some embodiments, the carbon nanoparticles and aggregates described herein are produced using the microwave plasma reactors with gas residence times from 0.001 seconds to 100 seconds, or from 0.01 seconds to 100 seconds, or from 0.1 seconds to 100 seconds, or from 0.001 seconds to 10 seconds, or from 0.01 seconds to 10 seconds, or from 0.1 seconds to 10 seconds.

In some embodiments, the carbon nanoparticles and aggregates including the different carbon allotropes described herein are produced using the microwave plasma reactors with liquid precursor flows from 0.1 L/min to 1000 L/min, or from 2 L/min to 1000 L/min, or from 5 L/min to 1000 L/min, or greater than 1 L/min, or greater than 2 L/min, or greater than 5 L/min, or greater than 10 L/min, or greater than 100 L/min. In some embodiments, the carbon nanoparticles and aggregates described herein are produced using the microwave plasma reactors with liquid precursor residence times from 0.001 seconds to 100 seconds, or from 0.01 seconds to 100 seconds, or from 0.1 seconds to 100 seconds, or from 0.001 seconds to 10 seconds, or from 0.01 seconds to 10 seconds, or from 0.1 seconds to 10 seconds.

In some embodiments, the precursor material flow rate (i.e., gas or liquid flow rate) is used to tailor the mixture of allotropes produced within the reactor. At higher flow rates, the residence times are shorter, and at lower flow rates the residence times are longer. In some embodiments, there is one or more carbon allotropes that form initially, and other carbon allotropes that form subsequently and/or that grow on the surfaces of the initially formed carbon allotrope. At higher flow rates (i.e., shorter residence times) the ratio of the initially formed allotrope to the subsequently formed allotropes will be higher than it will be at lower flow rates.

One example is the production of mixtures of graphene, graphite and MWSFs. In some embodiments, MWSFs form first, and the graphene and/or graphite materials form on the surfaces of the initially formed MWSFs. In embodiments when the mixture is produced with higher flow rates, the ratio of graphene and graphite to MWSFs is lower (e.g., as low as 10% or 20%). On the other hand, in embodiments when the mixture is produced with lower flow rates, the ratio of graphene and graphite to MWSFs is higher (e.g., up to 80% or 90%) because there is more time for additional layers of graphene and graphite to grow on the MWSF surfaces.

Another example is the production of mixtures of graphene, graphite and amorphous carbon. In some embodiments, amorphous carbon forms first, and the graphene and/or graphite materials form on the surfaces of the initially formed amorphous carbon. In embodiments when the mixture is produced with higher flow rates, the ratio of graphene and graphite to amorphous carbon is lower (e.g., as low as 10% or 20%). On the other hand, in embodiments when the mixture is produced with lower flow rates, the ratio of graphene and graphite to amorphous carbon is higher (e.g., up to 80% or 90%) because there is more time for additional layers of graphene and graphite to grow on the amorphous carbon surfaces.

It is important to note that other parameters, in addition to precursor material flow rate, also affect which carbon allotropes form, and the growth rate of each, including, for example, microwave parameters (e.g., energy, power, pulse rate), chamber geometry, reaction temperature, the presence of a filament, and the precursor and supply gas species utilized. For example, when producing graphene, or mixtures of graphene and graphite, the microwave energy and power, as well as the precursor and supply gas flow rates can impact the number of layers in the graphene, and/or the ratio of graphene to graphite produced. At higher power, the rate of growth of the carbon layers increases, and at longer residence times the number of layers that are able to grow increases.

In some embodiments, the carbon nanoparticles and aggregates described herein are produced using the microwave plasma reactors with chamber volumes from 100 cm$^3$ to 100,000 cm$^3$, or from 1000 cm$^3$ to 100,000 cm$^3$, or from 100 cm$^3$ to 10,000 cm$^3$, or from 1000 cm$^3$ to 10,000 cm$^3$, or from 1000 cm$^3$ to 5,000 cm$^3$. Multiple chambers can also be used in parallel in a single reactor, and multiple reactors can be used in parallel in the same reactor system.

In some embodiments, the carbon nanoparticles and aggregates described herein are produced using the microwave plasma reactors at production rates greater than 10 kg/hr, or greater than 1 kg/hr, or from 0.1 to 100 kg/hr, or from 1 to 100 kg/hr, or from 10 to 100 kg/hr, or from 0.1 to 10 kg/hr, or from 0.1 to 1 kg/hr, or from 1 to 10 kg/hr.

Figure 3:
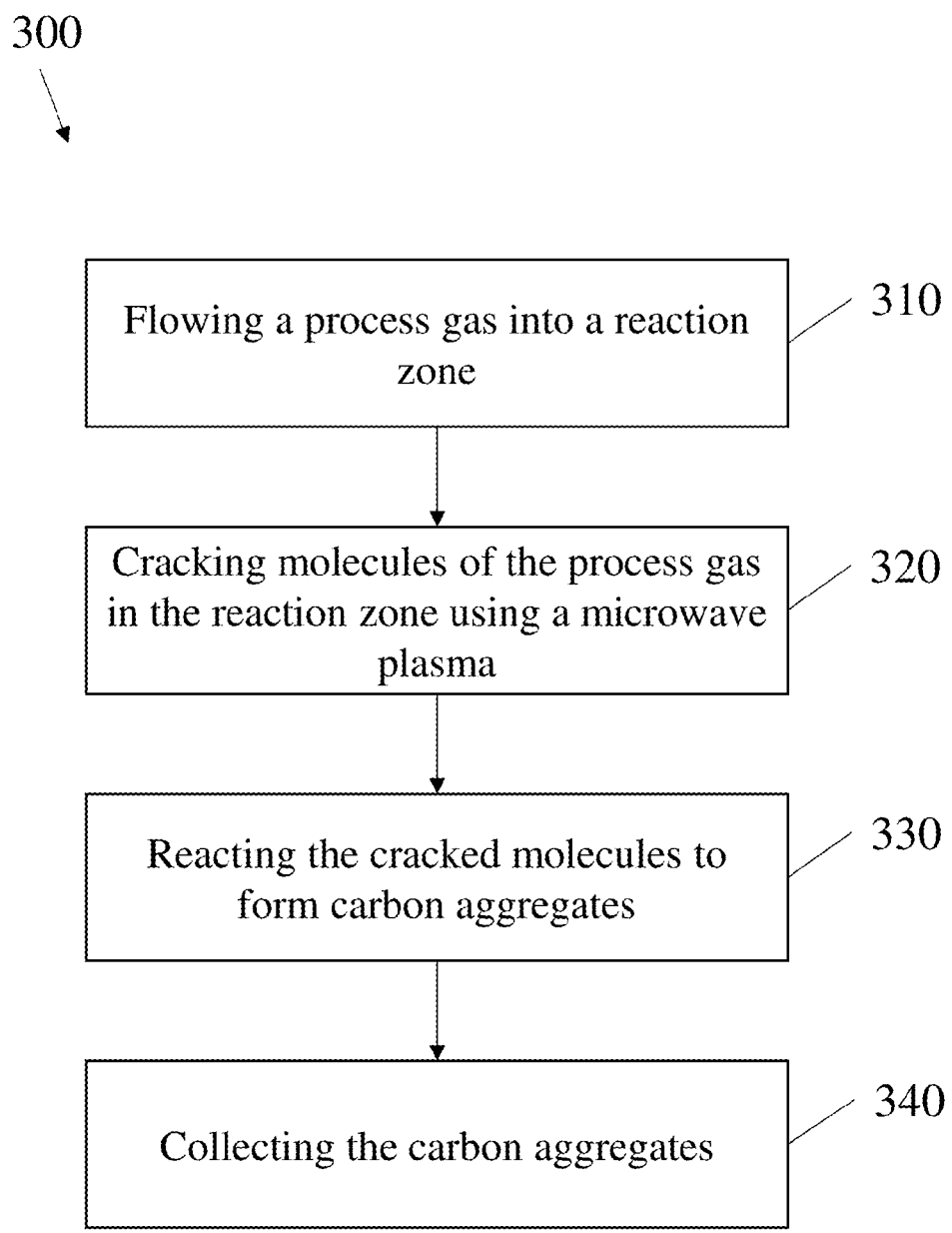
FIG. 3 is a flowchart of methods for generating the carbon particles, nanoparticles, aggregates and materials in accordance with embodiments of the present disclosure

A method for generating the carbon particles, nanoparticles, aggregates and materials described herein produced using microwave plasma reactors is shown in FIG. 3. In some embodiments, the method 300 comprises 310 flowing a process gas into a reaction zone, 320 cracking molecules of the process gas in the reaction zone using a microwave plasma, 330 reacting the cracked molecules to form carbon aggregates, and 340 collecting the carbon aggregates. In some embodiments, the carbon aggregates comprise graphene. In some embodiments, the carbon aggregates comprise graphene, graphite, MWSFs, connected MWSFs, amorphous carbon, other carbon allotropes, or combinations thereof. In some embodiments, carbon aggregates contain a ratio of carbon to other elements, except Hydrogen, is greater than 99%, a median size of the carbon aggregates is from 1 to 50 microns, a surface area of the carbon aggregates is from 50 to 200 m2/g, when measured using the Brunauer-Emmett-Teller (BET) method with nitrogen as the adsorbate, and the carbon aggregates, when compressed, have an electrical conductivity greater than 500 S/m.

Post-Processing Graphite and Graphene Materials

In some embodiments, the carbon particles, nanoparticles and aggregates containing graphite and graphene described herein are produced and collected, and no post-processing is done. In other embodiments, the carbon particles, nanoparticles and aggregates described herein are produced and collected, and some post-processing is done. Some examples of post-processing include mechanical processing, such as ball milling, grinding, attrition milling, micro-fluidizing, jet milling, and other techniques to reduce the particle size without damaging the carbon allotropes contained within. Some examples of post-processing include exfoliation processes such as shear mixing, chemical etching, oxidizing (e.g., Hummer method), thermal annealing, doping by adding elements during annealing (e.g., S, and N), steaming, filtering, and lypolizing, among others. Some examples of post-processing include sintering processes such as SPS (Spark Plasma Sintering, i.e., Direct Current Sintering), Microwave, and UV (Ultra-Violet), which can be conducted at high pressure and temperature in an inert gas. In some embodiments, multiple post-processing methods can be used together or in series. In some embodiments, the post-processing will produce functionalized carbon nanoparticles or aggregates described herein.

In some embodiments, the materials are mixed together in different combinations. In some embodiments, different carbon nanoparticles and aggregates containing graphite and graphene described herein are mixed together before post-processing. For example, different carbon nanoparticles and aggregates containing graphite and graphene with different properties (e.g., different sizes, different compositions, different purities, from different processing runs, etc.) can be mixed together. In some embodiments, the carbon nanoparticles and aggregates described herein could be mixed with graphene to change the ratio of the graphite to graphene in the mixture. In some embodiments, different carbon nanoparticles and aggregates containing graphite and graphene described herein are mixed together after post-processing. For example, different carbon nanoparticles and aggregates containing graphite and graphene with different properties and/or different post-processing methods (e.g., different sizes, different compositions, different functionality, different surface properties, different surface areas) can be mixed together.

In some embodiments, the carbon nanoparticles and aggregates described herein are produced and collected, and subsequently processed by mechanical grinding, milling, or exfoliating. In some embodiments, the processing (e.g., by mechanical grinding, milling, exfoliating, etc.) reduces the average size of the particles. In some embodiments, the processing (e.g., by mechanical grinding, milling, exfoliating, etc.) increases the average surface area of the particles. In some embodiments, the processing by mechanical grinding, milling or exfoliation shears off some fraction of the carbon layers, producing sheets of graphite mixed with the carbon nanoparticles.

In some embodiments, the surface area of the carbon aggregates after subsequent processing by mechanical grinding, milling, or exfoliating, when measured using the nitrogen Brunauer-Emmett-Teller (BET) (i.e., the BET method with nitrogen as the adsorbate) or the Density Functional Theory (DFT) method, is from 50 to 300 m$^2$/g, or from 100 to 300 m$^2$/g, or from 50 to 200 m$^2$/g, or from 50 to 150 m$^2$/g, or from 60 to 110 m$^2$/g, or from 50 to 100 m$^2$/g, or from 70 to 100 m$^2$/g.

In some embodiments, the mechanical grinding or milling is performed using a ball mill, a planetary mill, a rod mill, a shear mixer, high-shear granulator, an autogenous mill, or other type of machine used to break solid materials into smaller pieces by grinding, crushing or cutting. In some embodiments, the mechanical grinding, milling or exfoliating is performed wet or dry. In some embodiments, the mechanical grinding is performed by grinding for some period of time, then idling for some period of time, and repeating the grinding and idling for a number of cycles. The grinding period may be, for example, from 1 minute to 20 minutes, or from 1 minute to 10 minutes, or from 3 minutes to 8 minutes, or approximately 3 minutes, or approximately 8 minutes. In some embodiments, the idling period is from 1 minute to 10 minutes, or approximately 5 minutes, or approximately 6 minutes. In some embodiments, the number of grinding and idling cycles is from 1 to 100, or from 5 to 100, or from 10 to 100, or from 5 to 10, or from 5 to 20. In some embodiments, the total amount of time grinding and idling is from 10 minutes to 1200 minutes, or from 10 minutes to 600 minutes, or from 10 minutes to 240 minutes, or from 10 minutes to 120 minutes, or from 100 minutes to 90 minutes, or from 10 minutes to 60 minutes, or approximately 90 minutes, or approximately 120 minutes.

In some embodiments, the grinding steps in the cycle are performed by rotating a mill in one direction for a first cycle (e.g., clockwise), and then rotating a mill in the opposite direction (e.g., counter-clockwise) for the next cycle. In some embodiments, the mechanical grinding or milling is performed using a ball mill, and the grinding steps are performed using a rotation speed from 100 to 1000 rpm, or from 100 to 500 rpm, or approximately 400 rpm. In some embodiments, the mechanical grinding or milling is performed using a ball mill using a milling media with a diameter from 0.1 mm to 20 mm, or from 0.1 mm to 10 mm, or from 1 mm to 10 mm, or approximately 0.1 mm, or approximately 1 mm, or approximately 10 mm. In some embodiments, the mechanical grinding or milling is performed using a ball mill using a milling media composed of metal such as steel, an oxide such as zirconium oxide (zirconia), yttria stabilized zirconium oxide, silica, alumina, magnesium oxide, or other hard materials such as silicon carbide or tungsten carbide.

In some embodiments, the carbon nanoparticles and aggregates described herein are produced and collected, and subsequently processed using elevated temperatures, such as thermal annealing, or sintering. In some embodiments, the processing using elevated temperatures is done in an inert environment such as nitrogen or argon. In some embodiments, the processing using elevated temperatures is done at atmospheric pressure, or under vacuum, or at low pressure. The elevated temperatures may be, for example, temperatures from 500° C. to 2500° C., or from 500° C. to 1500° C., or from 800° C. to 1500° C., or from 800° C. to 1200° C., or from 800° C. to 1000° C., or from 2000 to 2400° C., or approximately 800° C., or approximately 1000° C., or approximately 1500° C., or approximately 2000° C., or approximately 2400° C.

In some embodiments, the carbon nanoparticles and aggregates described herein are produced and collected, and subsequently additional elements or compounds are added, thereby incorporating the unique properties of the carbon nanoparticles and aggregates into other mixtures of materials. For example, nickel can be added to increase the magnetic permeability of the carbon nanoparticles and aggregates, or the degree of magnetization that the carbon nanoparticles and aggregates obtain in response to an applied magnetic field. Another example is the addition of sulfur to increase the surface area of the carbon nanoparticles and aggregates by forcing the carbon layers to separate. For example, adding sulfur can increase the surface area by 2 or 3 times compared with the material without sulfur. Another method to increase the surface area is through oxidation; however, the resulting compounds (e.g., graphene oxide) are insulators. The methods described herein, e.g., using sulfur, can produce particles with high surface areas that are conductive.

In some embodiments, the surface area of the carbon aggregates after subsequent processing that adds sulfur, when measured using the nitrogen Brunauer-Emmett-Teller (BET) or the Density Functional Theory (DFT) method, is from 50 to 300 $m^2/g$, or from 100 to 300 $m^2/g$, or from 50 to 200 $m^2/g$, or from 50 to 150 $m^2/g$, or from 60 to 110 $m^2/g$, or from 50 to 100 $m^2/g$, or from 70 to 100 $m^2/g$.

In some embodiments, either before or after post-processing, the carbon nanoparticles and aggregates described herein are added to solids, liquids or slurries of other elements or compounds to form additional mixtures of materials incorporating the unique properties of the carbon nanoparticles and aggregates. In some embodiments, the carbon nanoparticles and aggregates described herein are mixed with other solid particles, polymers or other materials. The resulting powders or composites of the particles in a solid matrix of a different material, can be used in different applications, such as in lubricants or structural composite materials. In some embodiments, the carbon nanoparticles and aggregates described herein are mixed with liquids to produce inks for different applications, such as conductive inks. The resulting inks can also be coated on a substrate or infused in another material for various applications such as capacitor or battery electrodes. In some embodiments, the carbon nanoparticles and aggregates described herein are mixed with solvents and optionally other particles to create slurries, which can then be coated or printed onto other surfaces in various applications, such as printed conductor antennas.

In some embodiments, either before or after post-processing, the carbon nanoparticles and aggregates described herein are used in various applications, including but not limited to lubricant formulations (e.g., lubricants for high-speed or high-stress applications, lubricants for high-temperature environments, lubricants for high-thermal conductivity applications, and anti-stiction lubricants, among others), filtration and separation applications (e.g., chemical filters, water filtration, desalinization, gas separation, oxidation barrier, impermeable membranes, non-reactive filters, and carbon sequestration material, among others), transportation and industrial applications (e.g., rubber additives, tire additives, automobile tire additives, major components in tires, functionalized additives for tires, couplings, mounts, elastomeric o-rings, hoses, sealants, and epoxies, among others), metamaterials formulations (e.g., the particles or aggregates decorated with Ni, Co or Fe nanowires, carbon dielectric layered materials, and interface materials with functionalized surfaces, among other combinations with other materials that result in unexpected properties), electronics ink formulations (e.g., conductive inks, transparent conductive inks, 3D printed circuits and printed circuit boards, resistivity inks, dielectric inks, flexible electronics, piezoelectrics, antennas, rectennas, smart rectennas, electrochromic devices, triboelectric devices, microwave equipment, system inks, and identification systems, among others), other inks (e.g., cosmetics, and 3D printed structural inks, among others), coatings (e.g., anti-corrosion, super hydrophobic, room heating, de-icing, cooling, electro-static discharge (ESD), radiofrequency shielding (EMF shielding) radiofrequency absorbing (EMF absorbing), and fabric and textile coatings, among others), capacitor material formulations (e.g., super capacitor additives, high surface area carbon, high purity carbon, high surface area high purity carbon, and separators, among others), sensors and solid state electronics applications (e.g., chemical, humidity, touch, light, transistors, diodes, and integrated devices, among others), composite materials formulations (e.g., as additives for cement, steel, aluminum, plastics, and carbon fiber, among others), energy applications (e.g., hydrogen storage, anode composites, cathode composites, batteries, fuel cell electrodes, capacitors, and capacitor/battery hybrids, among others), in-vivo bio-medical applications (e.g., tissue engineering, drug delivery, metal delivery, biodegradable nanowire for neuro regeneration, and better health, among others), and ex-vivo bio-medical applications (e.g., filtration, skin electrodes, and other medical devices).

Additional Embodiments

In some embodiments, a carbon material comprises a plurality of carbon aggregates, each carbon aggregate having a plurality of carbon nanoparticles, each carbon nanoparticle including graphene, with no seed particles. The graphene in the carbon material has up to 15 layers. A ratio of carbon to other elements, except hydrogen, in the carbon aggregates is greater than 99%. A median size of the carbon aggregates is from 1 to 50 microns. A surface area of the carbon aggregates is at least 50 $m^2/g$, when measured using a Brunauer-Emmett-Teller (BET) method with nitrogen as the adsorbate. The carbon aggregates, when compressed, have an electrical conductivity greater than 500 S/m.

In some embodiments, the carbon material described above also includes one or more other carbon allotropes in addition to graphene, where a ratio of the graphene to the other carbon allotropes is greater than 90%.

In some embodiments, a Raman spectrum of the carbon material described above, using 532 nm incident light, has: a 2D-mode peak, a G-mode peak, and a 2D/G intensity ratio greater than 0.5.

In some embodiments, the surface area of the carbon aggregates described above is from 50 to 300 $m^2/g$, when measured using the nitrogen BET method.

In some embodiments, the electrical conductivity of the carbon aggregates described above is from 1000 to 20,000 S/m when compressed.

In some embodiments, the carbon material described above further includes amorphous carbon, where a ratio of the amorphous carbon to the graphene is less than 5%. A Raman spectrum of the carbon material comprising the amorphous carbon, using 532 nm incident light, has: a 2D-mode peak, a D-mode peak, a G-mode peak, a D/G intensity ratio greater than 0.5, a low intensity 2D-mode peak, and a shallow valley between the D-mode peak and G-mode peak.

In some embodiments, the carbon aggregates described above are post-processed using a method selected from the group consisting of milling, grinding, exfoliating, annealing, sintering, steaming, filtering, lypolizing, doping, and adding elements. For example, the surface area of the post-processed carbon aggregates may be from 50 to 1000 $m^2/g$, when measured using the nitrogen BET method.

In some embodiments, a carbon material comprises a plurality of carbon aggregates, each carbon aggregate having a plurality of carbon nanoparticles, each carbon nanoparticle including graphene and multi-walled spherical fullerenes, with no seed particles. The graphene in the carbon material has up to 15 layers. A Raman spectrum of the carbon material comprising the multi-walled spherical fullerenes, using 532 nm incident light, has: a D-mode peak; a G-mode peak; and a D/G intensity ratio less than 1.2. A ratio of carbon to other elements, except hydrogen, in the carbon aggregates is greater than 99%. A median size of the carbon aggregates is from 1 to 100 microns. A surface area of the carbon aggregates is at least 10 $m^2/g$, when measured using a Brunauer—Emmett—Teller (BET) method with nitrogen as the adsorbate. The carbon aggregates, when compressed, have an electrical conductivity greater than 500 S/m.

In some embodiments, the Raman spectrum of the carbon material described above comprising the multi-walled spherical fullerenes has a D/G intensity ratio from 0.9 to 1.1.

In some embodiments, a ratio of the multi-walled spherical fullerenes to the graphene in the carbon material described above is from 20% to 80%.

In some embodiments, the surface area of the carbon aggregates described above is from 10 to 200 $m^2/g$, when measured using the nitrogen BET method.

In some embodiments, the electrical conductivity of the carbon aggregates described above is from 1000 to 20,000 S/m when compressed.

In some embodiments, the multi-walled spherical fullerenes described above include connected multi-walled spherical fullerenes, in which at least some of the multi-walled spherical fullerenes are coated by layers of the graphene.

In some embodiments, the carbon aggregates described above are post-processed using a method selected from the group consisting of milling, grinding, exfoliating, annealing, sintering, steaming, filtering, lypolizing, doping, and adding elements. The surface area of the post-processed carbon aggregates may be, for example, from 50 to 500 $m^2/g$, when measured using the BET method with nitrogen as the adsorbate.

In some embodiments, a carbon material comprises a plurality of carbon aggregates, each carbon aggregate having a plurality of carbon nanoparticles, each carbon nanoparticle including a mixture of graphene and at least one other carbon allotrope, with no seed particles. The graphene in the carbon material has up to 15 layers. A ratio of carbon to other elements, except hydrogen, in the carbon aggregates is greater than 99%. A median size of the carbon aggregates is from 1 to 100 microns. A surface area of the carbon aggregates is at least 10 $m^2/g$, when measured using a Brunauer-Emmett-Teller (BET) method with nitrogen as the adsorbate. The carbon aggregates, when compressed, have an electrical conductivity greater than 100 S/m.

In some embodiments, a ratio of the graphene to the at least one other carbon allotrope in the carbon material described above is from 5% to 95%.

In some embodiments, a Raman spectrum of the carbon material comprising the graphene, using 532 nm incident light, has: a 2D-mode peak, a G-mode peak, and a 2D/G intensity ratio greater than 0.5

In some embodiments, the surface area of the carbon aggregates described above is from 10 to 200 $m^2/g$, when measured using the BET method with nitrogen as the adsorbate.

In some embodiments, the electrical conductivity of the carbon aggregates described above is from 100 to 20,000 S/m when compressed.

In some embodiments, the at least one other carbon allotrope of the carbon material described above includes multi-walled spherical fullerenes. A ratio of the graphene to the multi-walled spherical fullerenes may be from, for example, 20% to 80%. In certain embodiments, the multi-walled spherical fullerenes include connected multi-walled spherical fullerenes, in which at least some of the multi-walled spherical fullerenes are coated by layers of the graphene.

In some embodiments, the at least one other carbon allotrope described above comprises amorphous carbon. A ratio of the graphene to the amorphous carbon may be, for example, greater than 95%.

In some embodiments, the at least one other carbon allotrope in the carbon material described above comprises predominantly $sp^3$ hybridization. For example, the other carbon allotrope in the carbon material described above can comprise a fraction of carbon atoms with $sp^3$ hybridization that is greater than 50%, or greater than 60%, or greater than 70%, or greater than 80%, or greater than 90%. One method for determining the fraction of $sp^3$ hybridization in a carbon allotrope is Raman spectroscopy. In certain embodiments, the ratio of graphene to the other carbon allotrope having predominantly $sp^3$ hybridization is from 5% to 95%.

In some embodiments, the carbon aggregates described above are post-processed using a method selected from the group consisting of milling, grinding, exfoliating, annealing, sintering, steaming, filtering, lypolizing, doping, and adding elements. The surface area of the post-processed carbon aggregates may be, for example, from 50 to 2000 $m^2/g$, when measured using the BET method with nitrogen as the adsorbate.

In some embodiments, a carbon material comprises a plurality of carbon aggregates, each carbon aggregate having a plurality of carbon nanoparticles, each carbon nanoparticle including graphene and amorphous carbon, with no seed particles. The graphene in the carbon material has up to 15 layers. A Raman spectrum of the carbon aggregates containing the amorphous carbon, using 532 nm incident light, has a 2D-mode peak, a D-mode peak and a G-mode peak. A D/G intensity ratio is greater than 0.5, with a low intensity 2D-mode peak, and the D-mode peak and G-mode peak have a shallow valley between them. A ratio of carbon to other elements, except hydrogen, in the carbon aggregates is greater than 99%. A median size of the carbon aggregates is from 1 to 50 microns. A surface area of the carbon aggregates is greater than 50 $m^2/g$, when measured using the Brunauer—Emmett—Teller (BET) method with nitrogen as the adsorbate. The carbon aggregates, when compressed, have an electrical conductivity greater than 500 S/m.

Embodiments of the carbon material described in the preceding paragraph may include, for example, a ratio of the graphene to amorphous carbon the carbon material described above is greater than 90%. Embodiments may also include, where the surface area of the carbon aggregates described above is from 50 to 200 $m^2/g$, when measured using the nitrogen BET method. In other embodiments, the electrical conductivity of the carbon aggregates described above is from 1000 to 20,000 S/m when compressed. In further embodiments, the carbon aggregates described above are post-processed using a method selected from the group consisting of milling, grinding, exfoliating, annealing, sintering, steaming, filtering, lypolizing, doping, and adding elements. In yet further embodiments, the surface area of the post-processed carbon aggregates described above is from 50 to 1000 $m^2/g$, when measured using the BET method with nitrogen as the adsorbate In some embodiments, a carbon material comprises a plurality of carbon aggregates, each carbon aggregate having a plurality of carbon nanoparticles, each carbon nanoparticle including amorphous carbon, with no seed particles. A Raman spectrum of the carbon aggregates comprising amorphous carbon, using 532 nm incident light, has a 2D-mode peak, a D-mode peak and a G-mode peak. A D/G intensity ratio is greater than 0.5, with a low intensity 2D-mode peak, and the D-mode peak and G-mode peak have a shallow valley between them. A ratio of carbon to other elements, except hydrogen, in the carbon aggregates is greater than 99%. A median size of the carbon aggregates is from 1 to 100 microns. A surface area of the carbon aggregates is greater than 50 $m^2/g$, when measured using the Brunauer—Emmett—Teller (BET) method with nitrogen as the adsorbate.

Embodiments of the carbon material described in the preceding paragraph may further include one or more other carbon allotropes in addition to graphene, where a ratio of the graphene to the other carbon allotropes is from 5% to 95%. In embodiments of the carbon aggregates described above, the surface area is from 50 to 200$m^2/g$, when measured using the nitrogen BET method. In other embodiments, the carbon aggregates described above are post-processed using a method selected from the group consisting of milling, grinding, exfoliating, annealing, sintering, steaming, filtering, lypolizing, doping, and adding elements. In further embodiments, the surface area of the post-processed carbon aggregates described above is from 50 to 2000 $m^2/g$, when measured using the BET method with nitrogen as the adsorbate.

In some embodiments, a method for producing carbon aggregates includes supplying microwave energy into a field-enhancing waveguide having a reaction zone. A supply gas is added into a supply gas inlet, where the supply gas inlet is upstream of the reaction zone. A process material is added into a process material inlet, where the process material flows into the reaction zone. The process material is converted into separated components in the reaction zone. The field-enhancing waveguide may have a field-enhancing zone upstream of the reaction zone. The field-enhancing zone may have a decreasing cross-sectional area from a first cross-sectional area to a second cross-sectional area, where the second cross-sectional area extends along a reaction length that forms the reaction zone of the field-enhancing waveguide. The microwave energy propagates in a direction along the reaction length. A majority of the supply gas flow is parallel to the direction of the microwave energy propagation in the reaction zone. The supply gas is used to generate a plasma in the plasma zone. The converting of the process material in the reaction zone may occur at a pressure of at least 0.1 atmosphere. The separated components include carbon aggregates.

The method described above can be used to produce any of the carbon materials described herein. Variations of the method described above can also be performed to produce any of the carbon materials described herein.

In some embodiments, a method for producing carbon aggregates includes supplying microwave energy into a field-enhancing waveguide, and adding a supply gas into a supply gas inlet, where the supply gas inlet is upstream of the reaction zone. A process material is added into a process material inlet, where the process material flows into the reaction zone. The process material is converted into separated components in the reaction zone. The field-enhancing waveguide may include a first cross-sectional area and a second cross-sectional area, and a field-enhancing zone between the first cross-sectional area and the second cross-sectional area. The field-enhancing waveguide may also include a plasma zone and a reaction zone. The second cross-sectional area may be smaller than the first cross-sectional area, where the field-enhancing zone has a decreasing cross-sectional area from the first cross-sectional area to the second cross-sectional area. The second cross-sectional area may be farther away from the microwave energy source than the first cross-sectional area, and may extend along a reaction length that forms the reaction zone of the field-enhancing waveguide. The microwave energy propagates in a direction along the reaction length. A majority of the supply gas flow is parallel to the direction of the microwave energy propagation in the reaction zone. The supply gas is used to generate a plasma in the plasma zone. The separated components include carbon aggregates, where the ratio of carbon to other elements, except hydrogen, in the carbon aggregates is greater than 95% (or greater than 99.5%).

The method described in the preceding paragraph can be used to produce any of the carbon materials described herein. Variations of the method described above can also be performed to produce any of the carbon materials described herein.

In some embodiments, a method for producing carbon aggregates includes flowing a process gas into a reaction zone, and cracking molecules of the process gas in the reaction zone using a microwave plasma. The method also includes reacting the cracked molecules to form carbon aggregates having a mixture of one or more carbon allotropes, with no seed particle; and collecting the carbon aggregates. A ratio of carbon to other elements, except hydrogen, in the carbon aggregates is greater than 99%. A median size of the carbon aggregates is from 1 to 100 microns. A surface area of the carbon aggregates is from 50 to 200 m$^2$/g, when measured using the Brunauer—Emmett—Teller (BET) method with nitrogen as the adsorbate. The carbon aggregates, when compressed, have an electrical conductivity greater than 500 S/m. The reaction zone may be part of a field-enhancing waveguide, where the field-enhancing zone may have a decreasing cross-sectional area. The one or more carbon allotropes may include graphene, amorphous carbon, MWSFs, and/or connected MWSFs.

The method described in the above paragraph can be used to produce any of the carbon materials described herein. Variations of the method described above can also be performed to produce any of the carbon materials described herein.

EXAMPLES

Example 1: Graphite and Graphene Particles Produced Using Microwave Plasma Reactors In this first example, carbon particles and aggregates containing graphite and graphene were generated using a microwave plasma reactor system, described in embodiments above. The microwave plasma reactor in this example had a main body made from stainless steel with a quartz inner wall material. However, the quartz inner wall material is not needed in all cases, and similar carbon materials can be produced in reactors containing not quartz in or adjacent to the reaction zone. The reaction zone volume was approximately 45 cm$^3$. The precursor material was methane, and was optionally mixed with a supply gas (e.g., argon). The flow rate of methane was from 1 to 20 L/min, the flow rate of the supply gas was from 0 to 70 L/min. With those flow rates and the tool geometry, the residence time of the gas in the reaction chamber was from approximately 0.001 second to approximately 2.0 seconds, and the carbon particle production rate was from approximately 0.1 g/hr to approximately 15 g/hr. After the aggregates were synthesized and collected, they were post-processed by annealing at a temperature from 1000 to 2200° C. in an inert atmosphere for a duration of approximately 60 to approximately 600 minutes.

The particles produced in this example contained graphite and graphene, and no seed particles. The particles in this example had a ratio of carbon to other elements (other than hydrogen) of approximately 99.97% or greater.

Figure 4A:
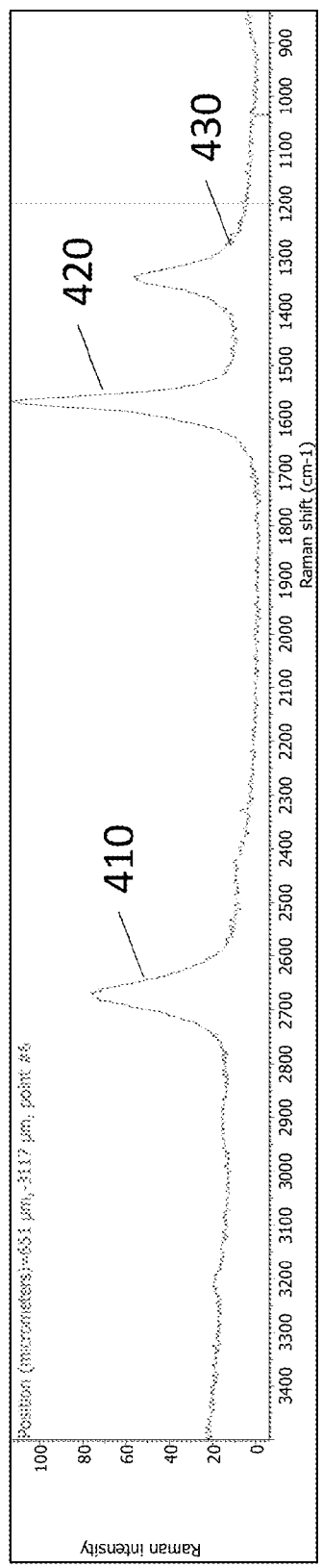
FIG. 4A shows a Raman spectrum from as-synthesized carbon aggregates containing graphite and graphene in a first example, in accordance with some embodiments.

FIG. 4A shows a Raman spectrum of the as-synthesized carbon particles of this example, taken using 532 nm incident light. The particles in FIG. 4A were produced using precursors containing argon. The spectrum has a 2D-mode peak 410 at approximately 2690 cm$^{-1}$, a G-mode peak 420 at approximately 1580 cm$^{-1}$, and a D-mode peak 430 at approximately 1350 cm$^{-1}$, and the 2D/G intensity ratio is greater than 0.5. The 2D/G intensity ratio for the particles produced in FIG. 4A is approximately 0.7.

The size of the aggregates in this example have a median of approximately 11.2 microns as-synthesized, and approximately 11.6 microns after annealing. The size distribution of the as-synthesized aggregates had a 10$^{th}$ percentile of approximately 2.7 microns, and a 90$^{th}$ percentile of approximately 18.3 microns. The annealed aggregates size distribution had a 10$^{th}$ percentile of approximately 4.2 microns, and a 90$^{th}$ percentile of approximately 25.5 microns.

The electrical conductivity of the aggregates was measured after being compressed into pellets. The as-synthesized material had a conductivity of 800 S/m when compressed using 2000 psi of pressure, and a conductivity of 1200 S/m when compressed using 12,000 psi of pressure. The annealed material had a conductivity of 1600 S/m when compressed using 2000 psi of pressure, and a conductivity of 3600 S/m when compressed using 12,000 psi of pressure.

Figure 4B:
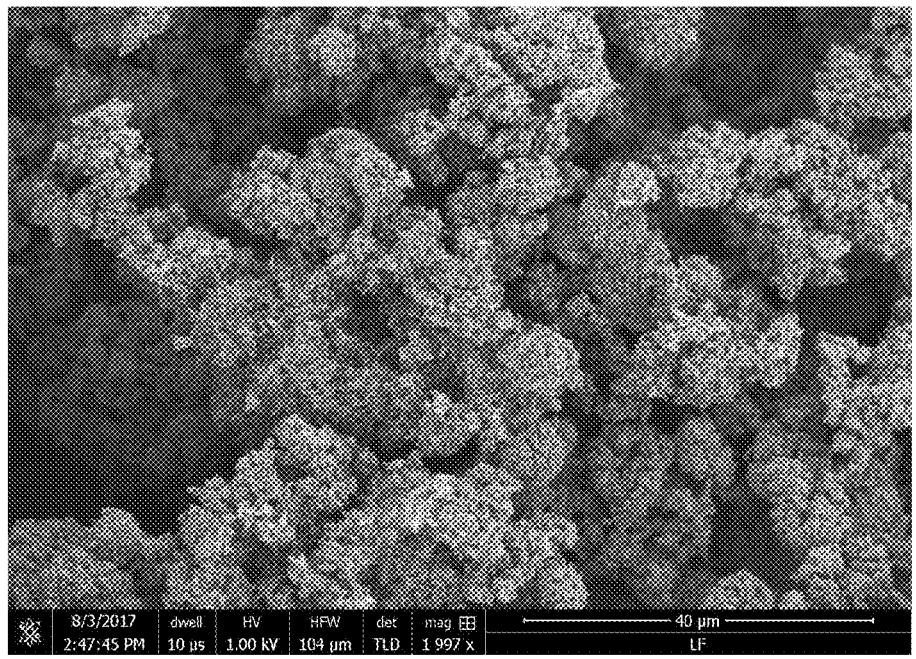
FIGS. 4B and 4C show scanning electron microscope (SEM) images from as-synthesized carbon aggregates containing graphite and graphene in a first example, in accordance with some embodiments.
Figure 4C:
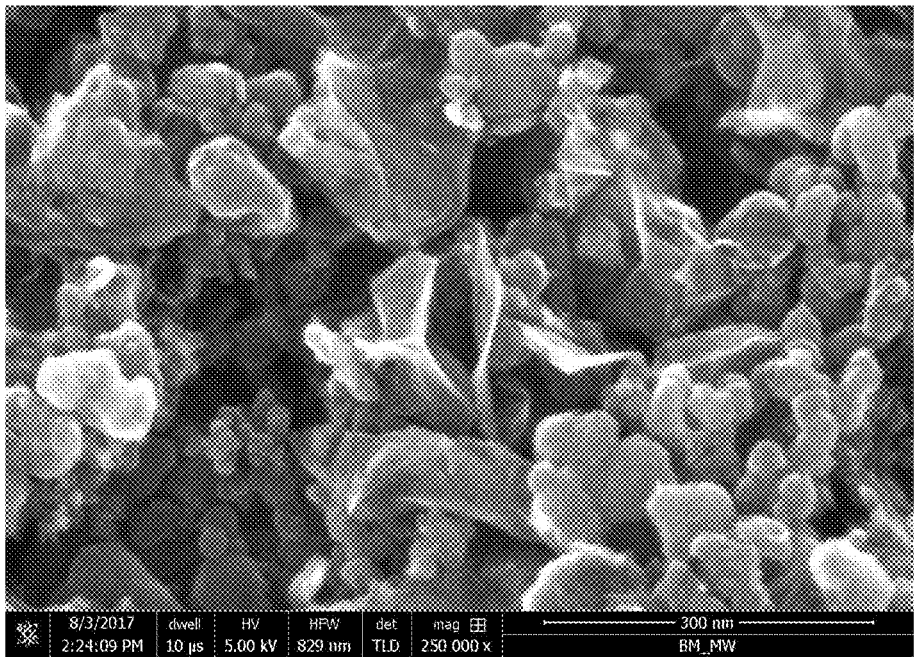
Figure 4D:
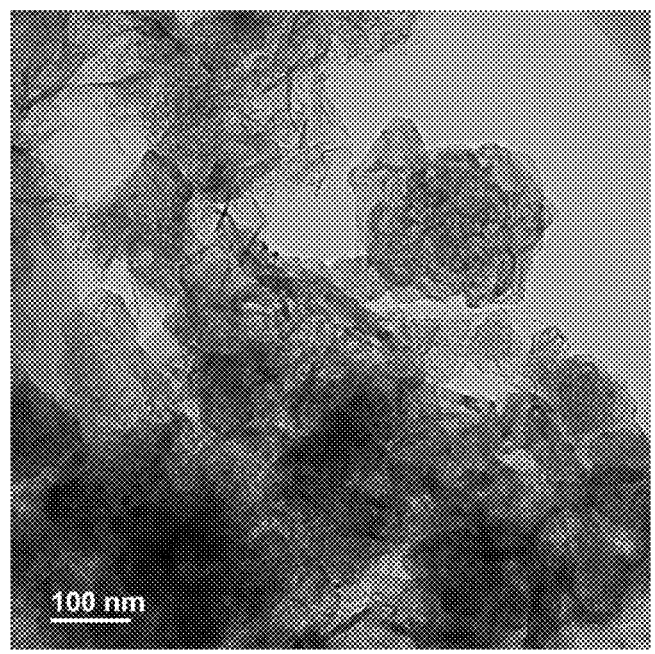
FIGS. 4D and 4E show transmission electron microscope (TEM) images from as-synthesized carbon aggregates containing graphite and graphene in a first example, in accordance with some embodiments.
Figure 4E:
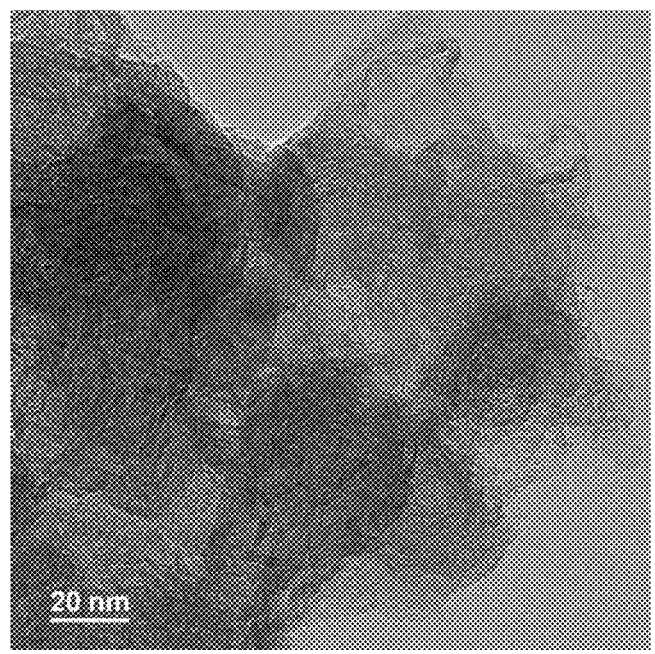

FIGS. 4B and 4C show SEM images, and FIGS. 4D and 4E show TEM images, of as-synthesized carbon aggregates of this example showing the graphite and graphene allotropes. The layered graphene is clearly shown within the distortion (wrinkles) of the carbon. The 3D structure of the carbon allotropes is also visible.

The surface area of the aggregates in this example were measured using the nitrogen BET method and the DFT method. The surface area of the aggregates as determined by the BET method was approximately 85.9 m$^2$/g. The surface area of the aggregates as determined by the DFT method was approximately 93.5 m$^2$/g.

In contrast to conventionally produced carbon materials, the microwave plasma reactor produced carbon particles and aggregates in this example contained graphite and graphene and no seed particles, and had high purity, Raman signatures indicating a high degree of order, high electrical conductivities, and large surface areas.

Example 2: Graphite, Graphene and Multi-Walled Spherical Fullerene Particles Produced Using Microwave Plasma Reactors In this second example, carbon particles and aggregates containing graphite, graphene, MWSFs, and connected MWSFs were generated using a microwave plasma reactor system described in Example 1, with the addition of a filament that includes a tantalum/tungsten resistive wire. The precursor material was methane, and was optionally mixed with a supply gas (e.g., argon). The flow rate of methane was from 1 to 100 L/min, and the flow rate of the supply gas was from 0 to 100 L/min. With those flow rates and the tool geometry, the residence time of the gas in the reaction chamber was from approximately 0.001 second to approximately 2.0 seconds, and the carbon particle production rate was from approximately 0.1 g/hr to approximately 15 g/hr. After the aggregates were synthesized and collected, they were post-processed by annealing at a temperature from 1000 to 2200° C. in an inert atmosphere for a duration of approximately 60 to approximately 600 minutes.

The particles produced in this example contained graphite, graphene, MWSFs and no seed particles. The particles in this example had a ratio of carbon to other elements (other than hydrogen) of approximately 99.5% or greater.

Figure 5A:
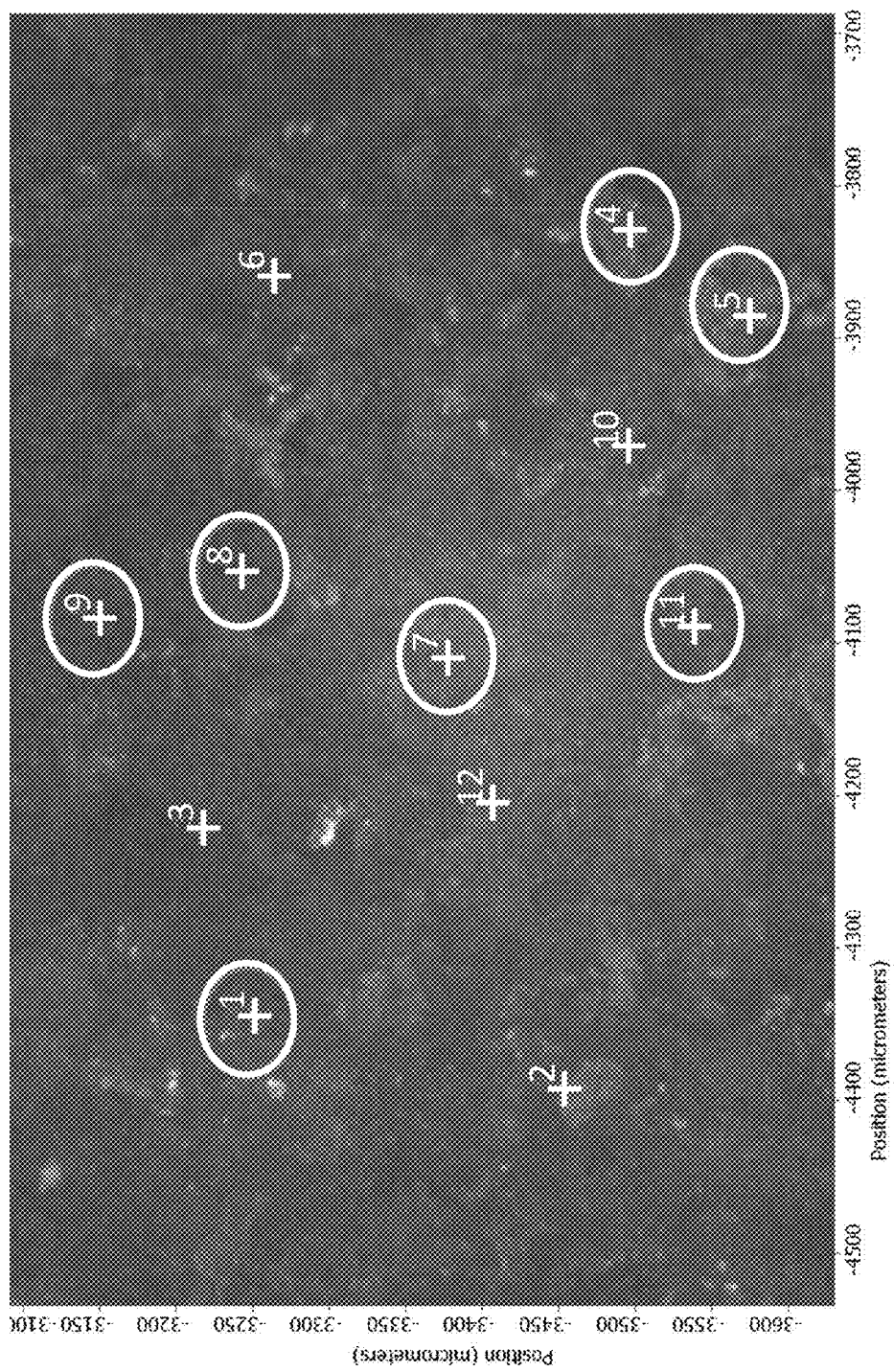
FIG. 5A shows a top down image of as-synthesized carbon aggregates containing graphite, graphene and multi-walled spherical fullerenes in a second example, in accordance with some embodiments.
Figure 5B:
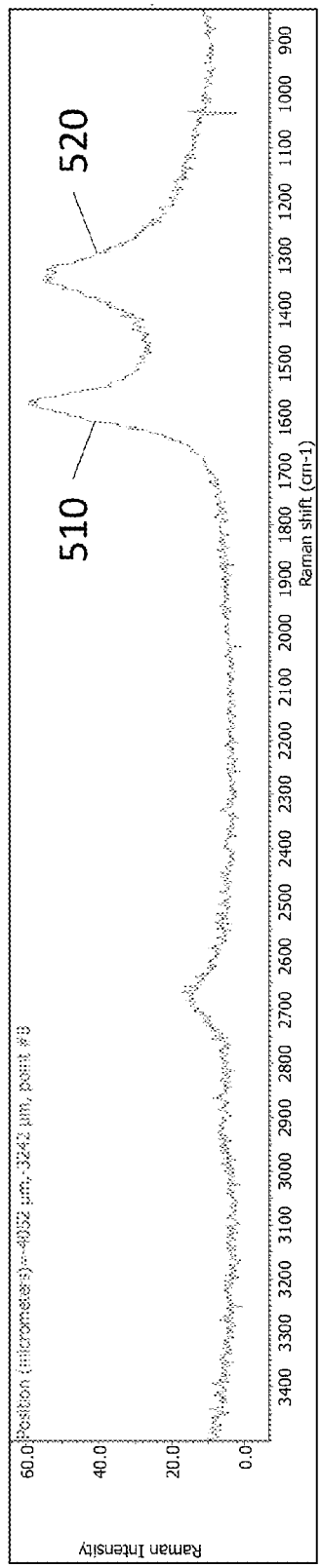
FIG. 5B shows a Raman spectrum from locations shown in FIG. 5A of as-synthesized carbon aggregates containing multi-walled spherical fullerenes in a second example, in accordance with some embodiments.
Figure 5C:
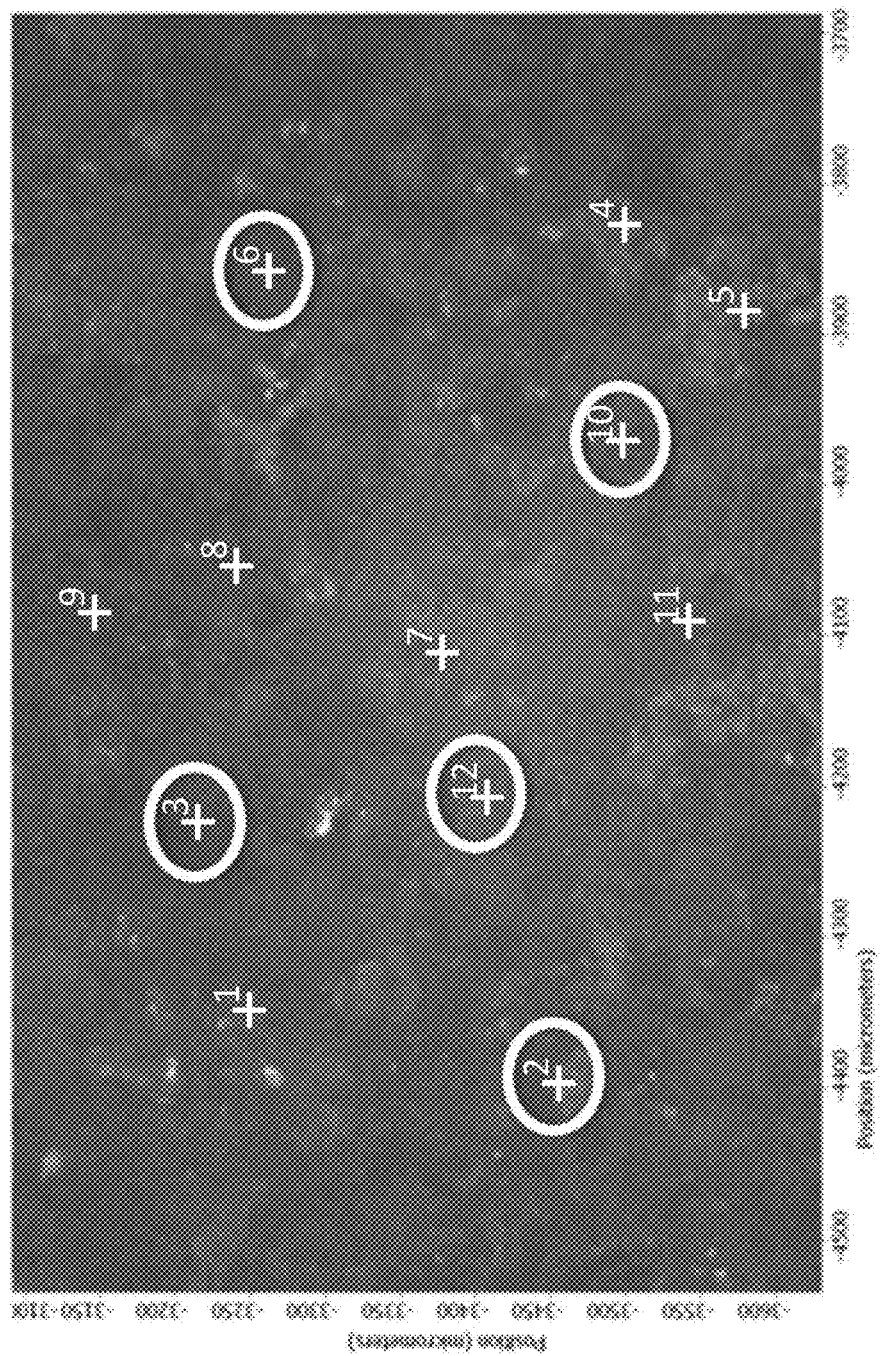
FIG. 5C is the top down image of FIG. 5A with different locations highlighted.
Figure 5D:
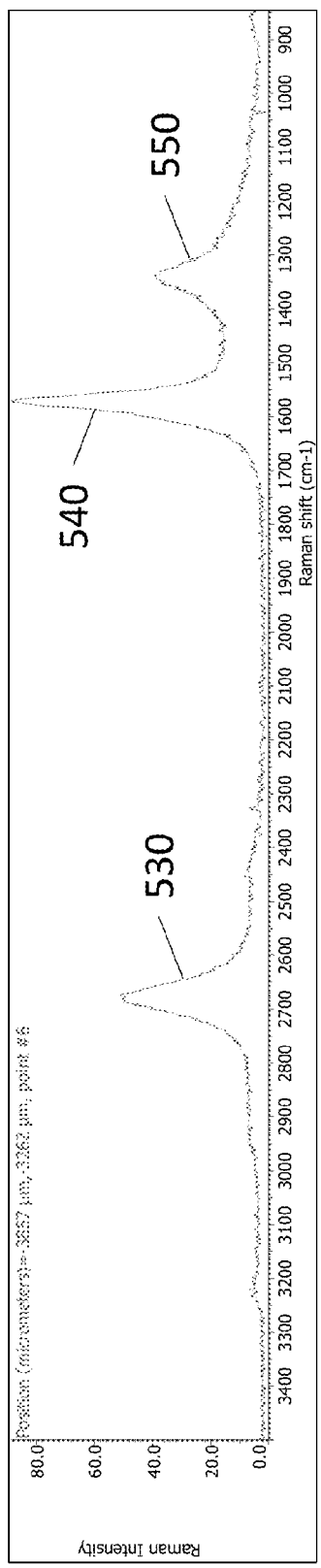
FIG. 5D shows a Raman spectrum from locations shown in FIG. 5C of as-synthesized carbon aggregates containing graphite and graphene in a second example, in accordance with some embodiments.

FIGS. 5A-5D show Raman spectra of the as-synthesized carbon particles of this example, taken using 532 nm incident light. FIGS. 5A and 5C are top down microscope images of the same region of a sample. The circles in FIG. 5A are regions where the Raman spectra indicate MWSF and connected MWSF materials are present. FIG. 5B is an example of a Raman spectra from one of the circled regions in FIG. 5A. The Raman spectra in FIG. 5B has a G-mode peak 510 at approximately 1580 cm$^{-1}$, and a D-mode peak 520 at approximately 1350 cm$^{-1}$, and the D/G intensity ratio is approximately 0.9. The circles in FIG. 5C are regions where the Raman spectra indicate graphite and graphene materials are present. FIG. 5D is an example of a Raman spectra from one of the circled regions in FIG. 5C. The Raman spectra in FIG. 5D has a 2D-mode peak 530 at approximately 2690 cm$^{-1}$, a G-mode peak 540 at approximately 1580 cm$^{-1}$, and a D-mode peak 550 at approximately 1350 cm$^{-1}$, and the 2D/G intensity ratio is approximately 0.6.

The size of the aggregates in this example have a median from approximately 10.2 microns to 19.0 microns as-synthesized, and the size remained approximately the same after annealing. The particle size distribution of the as-synthesized aggregates had a $10^{th}$ percentile from approximately 1.8 microns to approximately 6.5 microns, and a $90^{th}$ percentile from approximately 18.0 microns to approximately 37.3 microns. The particle size distribution of the annealed aggregates remained approximately the same after annealing.

The electrical conductivity of the aggregates was measured after being compressed into pellets. The as-synthesized material had a conductivity of 2100 S/m when compressed using 2000 psi of pressure, and a conductivity of 4300 S/m when compressed using 12,000 psi of pressure. The annealed material had a conductivity of 2300 S/m when compressed using 2000 psi of pressure, and a conductivity of 4100 S/m when compressed using 12,000 psi of pressure.

FIGS. 5E-5J show TEM images of as-synthesized carbon aggregates of this example showing graphite, graphene and MWSF allotropes. The images in FIGS. 5E-5G mainly show graphite and graphene materials, and the images in FIGS. 5H-5J show the MWSFs present in the material. The images show carbon nanoparticles containing the MWSFs, and connected MWSFs, with layers of graphene coating and connecting the MWSFs.

The surface area of the aggregates in this example were measured using the nitrogen BET method and the DFT method. The surface area of the aggregates as determined by the BET method was from approximately 69.8 $m^2/g$ to approximately 106.7 $m^2/g$. The surface area of the aggregates as determined by the DFT method was from approximately 67.3.5 $m^2/g$ to approximately 106.4 $m^2/g$.

In contrast to conventionally produced carbon materials, the microwave plasma reactor produced carbon particles and aggregates in this example contained graphite, graphene, MWSFs and no seed particles, and had high purity, Raman signatures indicating a high degree of order, high electrical conductivities, and large surface areas.

Example 3: Graphite, Graphene and Amorphous Carbon Particles Produced Using Microwave Plasma Reactors In this third example, carbon particles and aggregates containing graphite, graphene and amorphous carbon were generated using a microwave plasma reactor system as described in Example 1. The precursor material contained methane, or isopropyl alcohol (IPA), or ethanol, or a condensed hydrocarbon (e.g., hexane). The carbon containing precursors were optionally mixed with a supply gas (e.g., argon). When gaseous methane was used, the flow rate of methane was from 1 to 20 L/min, and the flow rate of the supply gas was from 0 to 70 L/min. When the precursor material was a liquid mixture of IPA and ethanol, the flow rate of the liquid mixture was from 0.1 to 100 mL/min. In some other cases, a condensed hydrocarbon was used and the flow rate of the hydrocarbon was approximately 3 L/min. With those flow rates and the tool geometry, the residence time of the gas in the reaction chamber was from approximately 0.001 second to approximately 2.0 seconds, and the carbon particle production rate was from approximately 0.1 g/hr to approximately 15 g/hr. After the aggregates were synthesized and collected, they were post-processed by annealing at a temperature from 1000 to 2200° C. in an inert atmosphere for a duration of approximately 60 to approximately 600 minutes.

The particles produced in this example contained graphite, graphene, amorphous carbon and no seed particles. The particles in this example had a ratio of carbon to other elements (other than hydrogen) of approximately 99.5% or greater.

FIGS. 6A and 6B show Raman spectra of the as-synthesized carbon particles of this example, taken using 532 nm incident light. FIG. 6A shows a Raman spectra indicative of the amorphous carbon allotrope present in the material. The spectra in FIG. 6A has a 2D-mode peak 610 at approximately 2690 $cm^{-1}$, a G-mode peak 620 at approximately 1580 $cm^{-1}$, and a D-mode peak 630 at approximately 1350 $cm^{-1}$, the D/G intensity ratio is approximately 0.9, there is low intensity 2D-mode peak, and the D-mode peak and G-mode peak have a shallow valley between them. FIG. 6B shows a Raman spectra indicative of the graphite and graphene allotropes present in the material. The Raman spectra in FIG. 6B has a 2D-mode peak at approximately 2690 $cm^{-1}$, a G-mode peak at approximately 1580 $cm^{-1}$, and a D-mode peak at approximately 1350 $cm^{-1}$, and the 2D/G intensity ratio is approximately 0.6.

The size of the aggregates in this example have a median from approximately 12.5 microns to 18.7 microns as-synthesized. The particle size distribution of the as-synthesized aggregates had a $10^{th}$ percentile from approximately 2.4 microns to approximately 5.0 microns, and a $90^{th}$ percentile from approximately 19.5 microns to approximately 30.4 microns.

The electrical conductivity of the aggregates was measured after being compressed into pellets. The as-synthesized material had a conductivity of approximately 1300 S/m when compressed using 2000 psi of pressure, and a conductivity of approximately 2200 S/m when compressed using 12,000 psi of pressure.

FIGS. 6C-6E show TEM images of as-synthesized carbon nanoparticles of this example showing the graphite, graphene and amorphous carbon allotropes. The layers of graphene and other carbon materials can be clearly seen in the images.

The surface area of the aggregates in this example were measured using the nitrogen BET method and the DFT method. The surface area of the aggregates as determined by the BET method was approximately 74.9 $m^2/g$. The surface area of the aggregates as determined by the DFT method was approximately 76.5 $m^2/g$.

In contrast to conventionally produced carbon materials, the microwave plasma reactor produced carbon particles and aggregates in this example contained graphite, graphene and amorphous carbon allotropes and no seed particles, and had high purity, Raman signatures indicating a high degree of order, high electrical conductivities, and large surface areas.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A carbon material comprising:
a plurality of carbon aggregates, each carbon aggregate comprising a plurality of carbon nanoparticles, each carbon nanoparticle comprising graphene, with no seed particles;
wherein:
the graphene in the plurality of carbon nanoparticles comprises up to 15 layers;
a percentage of carbon to other elements, except hydrogen, in the carbon aggregates is greater than 99%;
a median size of the carbon aggregates that comprise the carbon nanoparticles is from 1 to 50 microns;
a surface area of the carbon aggregates is from 50 $m^2/g$ to 300 $m^2/g$, when measured via a Brunauer-Emmett-Teller (BET) method with nitrogen as the adsorbate; and
the carbon aggregates, when compressed, have an electrical conductivity from 500 S/m to 20,000 S/m.

2. The carbon material of claim 1, further comprising one or more other carbon allotropes in addition to graphene, wherein a percentage of the graphene to the other carbon allotropes is greater than 90%.

3. The carbon material of claim 1, wherein a Raman spectrum of the carbon material, using 532 nm incident light, comprises: a 2D-mode peak; a G-mode peak; and a 2D/G intensity ratio greater than 0.5.

4. The carbon material of claim 1, further comprising amorphous carbon, wherein:
a percentage of the amorphous carbon to the graphene is less than 5%; and
a Raman spectrum of the carbon material comprising the amorphous carbon, using 532 nm incident light, comprises: a 2D-mode peak; a D-mode peak; a G-mode peak; a D/G intensity ratio greater than 0.5; a low intensity 2D-mode peak; and a shallow valley between the D-mode peak and G-mode peak.

5. The carbon material of claim 1, wherein the carbon aggregates are post-processed using a method selected from the group consisting of milling, grinding, exfoliating, annealing, sintering, steaming, filtering, lypolizing, doping, and adding elements.

6. The carbon material of claim 5, wherein the surface area of the post-processed carbon aggregates is from 50 to 1000 $m^2/g$, when measured using the BET method with nitrogen as the adsorbate.

7. A carbon material comprising:
a plurality of carbon aggregates, each carbon aggregate comprising a plurality of carbon nanoparticles, each carbon nanoparticle comprising graphene and multi-walled spherical fullerenes, with no seed particles;
wherein:
the graphene in the plurality of carbon nanoparticles comprises up to 15 layers;
a Raman spectrum of the carbon material comprising the multi-walled spherical fullerenes, using 532 nm incident light, comprises: a D-mode peak; a G-mode peak; and a D/G intensity ratio less than 1.2;
a percentage of carbon to other elements, except hydrogen, in the carbon aggregates is greater than 99%;
a median size of the carbon aggregates that comprise the carbon nanoparticles is from 1 to 100 microns;
a surface area of the carbon aggregates is at least from 10 $m^2/g$ to 300 $m^2/g$, when measured using a Brunauer-Emmett-Teller (BET) method with nitrogen as the adsorbate; and
the carbon aggregates, when compressed, have an electrical conductivity from 500 S/m to 20,000 S/m.

8. The carbon material of claim 7, wherein the D/G intensity ratio is from 0.9 to 1.1.

9. The carbon material of claim 7, wherein a ratio percentage of the multi-walled spherical fullerenes to the graphene is from 20% to 80%.

10. The carbon material of claim 7, wherein the multi-walled spherical fullerenes comprise connected multi-walled spherical fullerenes, in which at least some of the multi-walled spherical fullerenes are coated by layers of the graphene.

11. The carbon material of claim 7, wherein the carbon aggregates are post-processed using a method selected from the group consisting of milling, grinding, exfoliating, annealing, sintering, steaming, filtering, lypolizing, doping, and adding elements.

12. The carbon material of claim 11, wherein the surface area of the post-processed carbon aggregates is from 50 to 500 $m^2/g$, when measured using the BET method with nitrogen as the adsorbate.

13. A carbon material comprising:
a plurality of carbon aggregates, each carbon aggregate comprising a plurality of carbon nanoparticles, each carbon nanoparticle comprising a mixture of graphene and at least one other carbon allotrope, with no seed particles;
wherein:
the graphene in the plurality of carbon nanoparticles comprises up to 15 layers;
a percentage of carbon to other elements, except hydrogen, in the carbon aggregates is greater than 99%;
a median size of the carbon aggregates that comprise the carbon nanoparticles is from 1 to 100 microns;
a surface area of the carbon aggregates is from 10 $m^2/g$ to 300 $m^2/g$, when measured using a Brunauer-Emmett-Teller (BET) method with nitrogen as the adsorbate; and
the carbon aggregates, when compressed, have an electrical conductivity from 100 S/m to 20,000 S/m.

14. The carbon material of claim 13, wherein a percentage of the graphene to the at least one other carbon allotrope is from 5% to 95%.

15. The carbon material of claim 13, wherein a Raman spectrum of the carbon material comprising the graphene, using 532 nm incident light, comprises: a 2D-mode peak; a G-mode peak; and a 2D/G intensity ratio greater than 0.5.

16. The carbon material of claim 13, wherein the at least one other carbon allotrope comprises multi-walled spherical fullerenes.

17. The carbon material of claim 16, wherein a percentage of the graphene to the multi-walled spherical fullerenes is from 20% to 80%.

18. The carbon material of claim 16, wherein the multi-walled spherical fullerenes comprise connected multi-walled spherical fullerenes, in which at least some of the multi-walled spherical fullerenes are coated by layers of the graphene.

19. The carbon material of claim 13, wherein the at least one other carbon allotrope comprises amorphous carbon.

20. The carbon material of claim 19, wherein a percentage of the graphene to the amorphous carbon is greater than 95%.

21. The carbon material of claim 13, wherein the at least one other carbon allotrope comprises predominantly $sp^3$ hybridization.

22. The carbon material of claim 21, wherein the percentage of graphene to the at least one other carbon allotrope is from 5% to 95%.

23. The carbon material of claim 13, wherein the carbon aggregates are post-processed using a method selected from the group consisting of milling, grinding, exfoliating, annealing, sintering, steaming, filtering, lypolizing, doping, and adding elements.

24. The carbon material of claim 23, wherein the surface area of the post-processed carbon aggregates is from 50 to 2000 $m^2/g$, when measured using the BET method with nitrogen as the adsorbate.

* * * * *